(12) United States Patent
Mauder et al.

(10) Patent No.: US 12,483,232 B2
(45) Date of Patent: Nov. 25, 2025

(54) GATE DRIVER CIRCUIT AND POWER SWITCHING ASSEMBLY WITH GATE DRIVER CIRCUIT

(71) Applicant: Infineon Technologies Austria AG, Villach (AT)

(72) Inventors: Anton Mauder, Kolbermoor (DE); Massimo Grasso, Trivolzio (IT); Edward Fürgut, Dasing (DE)

(73) Assignee: Infineon Technologies Austria AG, Villach (AT)

( * ) Notice: Subject to any disclaimer, the term of this patent is extended or adjusted under 35 U.S.C. 154(b) by 107 days.

(21) Appl. No.: 18/474,744

(22) Filed: Sep. 26, 2023

(65) Prior Publication Data
US 2024/0113705 A1    Apr. 4, 2024

(30) Foreign Application Priority Data
Sep. 29, 2022 (EP) .................................. 22198808

(51) Int. Cl.
*H03K 17/06* (2006.01)
*H03K 17/082* (2006.01)
*H03K 17/687* (2006.01)

(52) U.S. Cl.
CPC ....... *H03K 17/063* (2013.01); *H03K 17/0822* (2013.01); *H03K 17/6871* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 5,706,189 A | * | 1/1998 | Majumdar | H02M 7/5387 363/95 |
| 6,387,772 B1 | * | 5/2002 | Chittipeddi | H10D 1/665 438/386 |
| 6,781,422 B1 | * | 8/2004 | Yang | H03K 17/04123 326/82 |
| 7,547,992 B2 | * | 6/2009 | Hiyama | H02M 1/088 307/113 |
| 7,906,953 B2 | * | 3/2011 | Dikken | H02M 3/33584 323/288 |
| 7,969,208 B2 | * | 6/2011 | Jansen | H03K 17/127 327/423 |
| 8,188,679 B2 | * | 5/2012 | Hoogzaad | H05B 45/48 315/312 |
| 9,312,852 B2 | * | 4/2016 | De Geeter | H03K 17/166 |
| 9,793,889 B2 | * | 10/2017 | Bayerer | H03K 17/16 |

(Continued)

*Primary Examiner* — Thomas J. Hiltunen
(74) *Attorney, Agent, or Firm* — Slater Matsil, LLP

(57) ABSTRACT

A power switching assembly includes a first driver circuit and a second driver circuit. The first driver circuit is supplied via a first internal supply node and a first reference node and drives a first gate signal. The second driver circuit is supplied via a second internal supply node and a second reference node and drives a second gate signal. The first gate signal and the second gate signal are configured to be in phase with each other. The first reference node and the second reference node are separated. A first buffer capacitor is electrically connected between the first internal supply node and the first reference node. A second buffer capacitor electrically connected between the second internal supply node and the second reference node.

20 Claims, 15 Drawing Sheets

(56) References Cited

U.S. PATENT DOCUMENTS

| | | | |
|---|---|---|---|
| 10,547,304 B2 * | 1/2020 | Yamaji | H10D 84/121 |
| 10,587,262 B1 | 3/2020 | Morini et al. | |
| 2008/0252372 A1 | 10/2008 | Williams | |
| 2019/0074828 A1 | 3/2019 | Yamaji | |

* cited by examiner

GATE DRIVER CIRCUIT AND POWER SWITCHING ASSEMBLY WITH GATE DRIVER CIRCUIT

This application claims the benefit of European Patent Application No. 22198808, filed on Sep. 29, 2022, which application is hereby incorporated herein by reference.

TECHNICAL FIELD

Examples of the present disclosure relate to a gate driver circuit. The present disclosure also relates to a power switching assembly including a gate driver circuit.

BACKGROUND

Semiconductor switches such as MOSFETs (metal oxide semiconductor field effect transistors) and IGBTs (insulated gate bipolar transistors) are widely used in power modules for high power converters, motor control, and others. The power modules are available in different configurations, such as a half-bridge, H-bridge, or six-pack. If individual semiconductor switches are not sufficient to drive the current required by the application, multiple semiconductor switches can be connected in parallel. Semiconductor switches electrically connected in parallel handle more current or the same current with less conduction loss, and can be driven by a single gate driver output signal. For example, replacing a single MOSFET with two MOSFETS connected in parallel and driven simultaneously by the same gate signal can approximately double the current capacity or can halve the conduction losses. The control of semiconductor switches connected in parallel can lead to unbalanced voltage and currents distributions between the semiconductor switches connected in parallel. There is a constant need for gate driver assemblies that provide a highly efficient and/or balanced control of semiconductor switches electrically connected and switched in parallel.

SUMMARY

An embodiment of the present disclosure relates to a power switching assembly that includes a first driver circuit and a second driver circuit. The first driver circuit is supplied via a first internal supply node and a first reference node and drives a first gate signal. The second driver circuit is supplied via a second internal supply node and a second reference node and drives a second gate signal. The first gate signal and the second gate signal are in phase. The first reference node and the second reference node are separated. A first buffer capacitor is electrically connected between the first internal supply node and the first reference node. A second buffer capacitor electrically connected between the second internal supply node and the second reference node.

Another embodiment of the present disclosure relates to a gate driver circuit that includes a first driver circuit and a second driver circuit. The first driver circuit is supplied via a first internal supply node and a first reference node and drives a first gate signal. The second driver circuit is supplied via a second internal supply node and a second reference node and drives a second gate signal. The first gate signal and the second gate signal are in phase. The first reference node and the second reference node are separated. A first reference pad is electrically connected with the first reference node. A second reference pad is electrically connected with the second reference node.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a power switching assembly and a gate driver circuit, and together with the description serve to explain principles of the embodiments. The drawings are not scaled and are for illustrative purposes only. Corresponding elements are designated by the same reference signs in the different drawings if not stated otherwise.

DETAILED DESCRIPTION OF ILLUSTRATIVE EMBODIMENTS

Figure 1A:
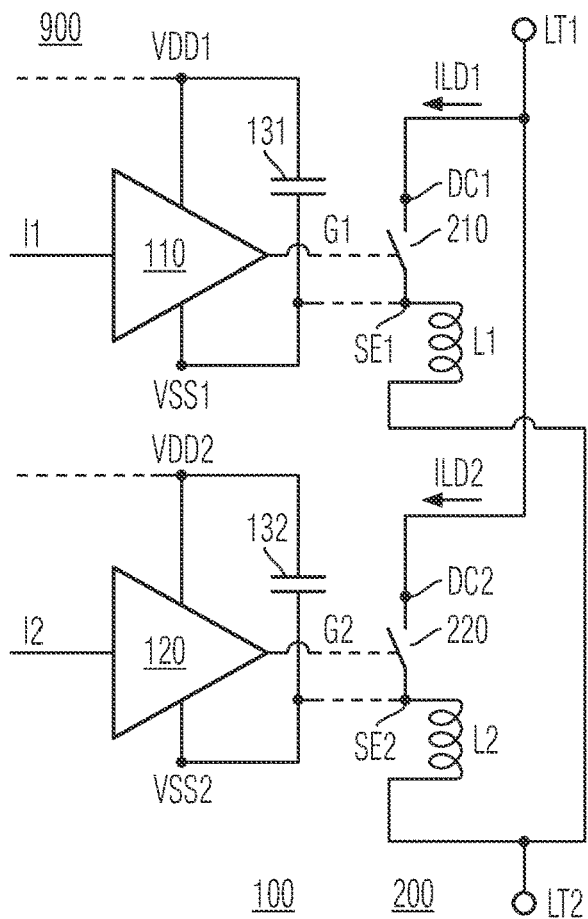
FIGS. 1A and 1B show a schematic circuit diagram and a timing diagram for a power switching assembly with two driver circuits according to an embodiment.

In the following detailed description, reference is made to the accompanying drawings, which form a part hereof and in which are shown by way of illustrations specific embodiments in which a gate driver circuit and a power switching assembly may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

Ranges given for physical dimensions include the boundary values. For example, a range for a parameter y from a to b reads as a y b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

In the context of layers and layered structures, the preposition "opposite" is used to denote an arrangement on opposite major surfaces of a layer. For example, a horizontal layer A formed on a side of a horizontal layer X opposite a horizontal layer B is separated from layer B by layer X in the vertical direction.

The embodiments concern a power switching assembly that includes a first driver circuit and a second driver circuit. The first driver circuit drives a first gate signal and is supplied via a first internal supply node and a first reference node. The second driver circuit drives a second gate signal and is supplied via a second internal supply node and a second reference node. The first gate signal and the second gate signal are in phase. The first reference node and the second reference node are separated. A first buffer capacitor is electrically connected between the first internal supply node and the first reference node. A second buffer capacitor is electrically connected between the second internal supply node and the second reference node.

Each of the first and second driver circuits may receive a low-level input signal from a transceiver or a controller IC and produces a high-current gate signal for the gate of a power semiconductor switch such as a power MOSFET, an IGBT, or a HEMT (high electron mobility transistor). Each driver circuit may include a level shifter in combination with an amplifier circuit, wherein the level shifter may shift the voltage level of the low-level input signal to higher voltage values, and wherein the amplifier circuit amplifies the gate signal.

A first supply voltage applied between the first internal supply node and the first reference node supplies the first driver circuit. A second supply voltage applied between the second internal supply node and the second reference node supplies the second driver circuit.

Each of the first gate signal and the second gate signal may alternate a voltage level between an active level to turn on the power semiconductor switch and an inactive level to turn off the power semiconductor switch, with both the active level and the inactive level being driven with an output current large enough to charge and discharge the gate capacitance of the power semiconductor switch sufficiently fast.

The first gate signal and the second gate signal are in phase, and change voltage level at the same frequency in the same direction from inactive to active and from active to inactive such that the second gate signal is primarily or exclusively active only when the first gate signal is active and the second gate signal is primarily or exclusively inactive only when the first gate signal is inactive. A transition of the second gate signal from the inactive level to the active level may be synchronous with a transition of the first gate signal from the inactive voltage level to the active voltage level, may slightly precede the transition of the first gate signal from the inactive voltage level to the active voltage level by a lead time Tld, or may lag the transition of the first gate signal from the inactive voltage level to the active voltage level by a lag time Tlg.

The first reference node and the second reference node are electrically sufficiently separated such that an electric potential of the first reference node can persistently differ from an electric potential of the second reference node. The first reference node and the second reference node can be electrically separated to such an extent that only a negligible compensation current flows between the first reference node and the second reference node. An effective ohmic resistance between the first reference node VSS1 and the second reference node VSS2 may be at least VDD/10 mA.

The first and the second buffer capacitor are separate from each other. Each buffer capacitor may be a pick- and placeable component mount- and solderable on a lead frame, a PCB (printed circuit board) or a DCB (direct copper bonded) substrate. Alternatively, the buffer capacitors may include one or two metal electrodes formed by deposition and integrated in a layer stack of a semiconductor die that includes the first driver circuit and/or the second driver circuit. In case the first driver circuit and the second driver circuit are SOI devices, electrodes of the buffer capacitors may be formed at opposite sides of a deep trench isolation structure extending through a semiconductor layer formed on an SOI insulator layer.

The first and second buffer capacitors supply the first and second driver circuits mainly during transients and may have the same capacitance. Since the first and second buffer capacitors supply the first and second driver circuits only during transients, the first and second buffer capacitors have a capacitance which is small compared to the capacitance for a bootstrap circuit provided to supply the gate driver of the high side switch in a half bridge configuration.

The first gate signal controls a first power semiconductor switch. The second gate signal controls a second power semiconductor switch. The first and second power semiconductor switches are electrically connected in parallel. During transitions from the on state to the off state and from the off state to the on state, a changing load current through parasitic inductances of the power semiconductor switch source/emitter wirings may induce comparatively high voltage drops across the parasitic inductances, thereby shifting the effective gate voltage.

Typically, a Kelvin connection parallel to the source wiring directly connects the reference potential of the gate signal with the load pad of the power semiconductor switch to decouple the gate voltage from effects caused by the load current. For power semiconductor devices connected in parallel, only one Kelvin connection is used, because providing Kelvin connections to more than one power semiconductor forms a current loop through the Kelvin connections and parallel to the load contacts, wherein comparative high compensation currents may temporarily flow through the Kelvin connections.

Instead, the separated reference nodes and the separated buffer capacitors provide independent, individual gate drive loops for each of the driver circuits. In particular, for each driver circuit separately, the output gate voltage can be controlled to be independent from a transient voltage drop across the parasitic inductance in the source or emitter wiring. No possibly harmful compensation currents flow in the gate drive loops.

The power switching assembly may include more than two driver circuits, wherein to each driver circuit a separate capacitor is electrically connected between the positive supply terminal of the concerned driver circuit and the negative supply terminal of the concerned driver circuit.

According to an embodiment, the first reference node may be electrically connected to a first reference pad and the second reference node may be electrically connected to a second reference pad.

The first reference pad may be formed at a front side of a semiconductor die including the first driver circuit. The second reference pad may be formed at a front side of a semiconductor die including the second driver circuit. Alternatively, the first reference pad and the second reference pad may be formed at a front side of a single semiconductor die that includes both the first driver circuit and the second driver circuit.

The first reference pad facilitates the first reference node to be connected to a source/emitter pad of a first power semiconductor switch, e.g., through a first bond wire. The second reference pad facilitates the second reference node to be connected to a source/emitter pad of a second power semiconductor switch, e.g., through a second bond wire.

According to an embodiment, the power switching assembly may include a charging circuit configured to charge the first buffer capacitor and the second buffer capacitor using an operating voltage in a first mode, and to decouple the operating voltage from the potentials across the first buffer capacitor and the second buffer capacitor in a second mode.

The operating voltage can be a constant supply voltage supplied by a constant voltage source between a positive voltage supply terminal and a negative voltage supply terminal of the driver circuit or between a positive voltage supply terminal of the driver circuit and a first load terminal of a power switching assembly including the driver circuit. The first load terminal may be a source lead in case the power semiconductor switches include MOSFETs or HEMTs, or an emitter lead in case the power semiconductor switches includes IGBTs. Alternatively, the operating voltage may be a toggling supply voltage supplied by a toggling voltage source between differential inputs of the power switching assembly and continuously alternating polarity.

The charging circuit is in the first mode mainly during the static portions of a switching cycle when almost no current flows to or from the gates of the power semiconductor switch and when the load currents of the controlled power semiconductor switches have almost reached the end values in the switching cycle. In the first mode, the charging circuit connects the external voltage source providing the constant or toggling supply voltage to the buffer capacitors and the external voltage source charges the buffer capacitors.

When parallel to the first load wiring of one of the power semiconductor switches a Kelvin connection is directly connected to the reference node of the respective driver circuit, the voltage at the internal supply node changes accordingly. When the potential at the internal supply node rises above the potential provided in the charging circuit for the internal supply node, the charging circuit prevents the buffer capacitor connected to the concerned driver circuit from being discharged via the voltage source supplying the supply voltage in the second mode.

According to an embodiment, the charging circuit may include a first charging diode electrically connected in forward direction between a positive supply port and the first internal supply node and a second charging diode electrically connected in forward direction between the positive supply port and the second internal supply node.

The positive supply port may include a pad and/or a package lead. The charging circuit may include elements in addition to the first and second charging diodes. Other examples of the charging circuit may include, e.g., transistors with controlled gate in place of or in addition to the charging diodes.

According to an embodiment, the first driver circuit may be configured to obtain the first gate signal from a low-level input signal and the second driver circuit may be configured to obtain the second gate signal from the low-level input signal.

The first driver circuit receives the low-level input signal, level-shifts, and current-amplifies the low-level input signal to obtain and output the first gate signal. The second driver circuit receives the low-level input signal, level-shifts, and current-amplifies the low-level input signal to obtain and output the second gate signal.

According to an embodiment, a first current limiting resistor may be electrically connected between a signal ground port and the first reference node, and a second current limiting resistor may be electrically connected between the signal ground port and the second reference node.

The signal ground port may include a pad and/or a package lead. The signal ground port facilitates decoupling the reference potential for the signals at the input side of the driver circuits from the low potential of a power stage that includes the power semiconductor switches and the power supply for the drivers. Loop currents that may occur during switching between the source connections of the power semiconductor switches may overstress wiring connections between the source or emitter of the first power semiconductor switch and the source or emitter of the second power semiconductor switch on the side of the driver circuits, e.g., between the first reference pad on the first driver circuit and the second reference pad on the second driver circuit. The resistance of the first current limiting resistor and the second current limiting resistor is selected high enough to attenuate the loop currents to an extent that avoids overstress of the wiring connections and low enough to allow sufficiently fast charging of the buffer capacitors. The first and second current limiting resistors may have the same resistance value.

According to an embodiment, the power switching assembly may include a differentiator circuit configured to obtain a differential input signal from a low-level input signal, wherein the first driver circuit may be configured to obtain the first gate signal from the differential input signal, and wherein the second driver circuit may be configured to obtain the second gate signal from the differential input signal.

The differentiator circuit receives the low-level input signal and transforms the input signal into the differential input signal. The differential input signal consists of a differential pair of signals, each transmitted on its own conductor. The input signal may be a "digital alike" signal, e.g. a low-level logic signal and may be directly provided by a microcontroller or a transceiver circuit.

The differentiator circuit decouples the input signals of the driver circuits from the potential of the first and second reference nodes without the need for decoupling elements, e.g., current limiting resistors between the first and second reference nodes.

According to an embodiment, the charging circuit may include a first supply diode electrically connected in forward direction between a first differential port and the first internal supply node, a second supply diode electrically connected in forward direction between a second differential port and the first internal supply node, a third supply diode electrically connected in forward direction between the first differential port and the second internal supply node, and a fourth supply diode electrically connected in forward direction between the second differential port and the second internal supply node.

The first driver circuit may be configured to obtain the first gate signal from a differential input/supply signal applied between the first differential port and the second differential port. The second driver circuit may be configured to obtain the second gate signal from the differential input/supply signal applied between the first differential port and the second differential port.

In addition, the differential input/supply signal may supply the first and second driver circuits. The differential input/supply signal is provided to deliver enough current to recharge the buffer capacitors sufficiently fast. In particular, a differential driver stage outputting the differential input/supply signal outputs the differential input/supply signal with sufficient voltage and current levels to reliably recharge the buffer capacitors within each switching cycle of the power semiconductor switches.

The power switching assembly may further include a protection circuit configured to receive a sense signal and output a fault signal to the first driver circuit and/or the second driver circuit, when the sense signal indicates a fault condition.

The sense signal may be a current sense signal, wherein a voltage level of the sense signal is a function of a load current through the first power semiconductor switch. The protection circuit may monitor the voltage level of the sense signal and may change a voltage level of the fault signal from an inactive level to an active level in case the sense signal fulfils a predetermined condition. The predetermined condition may be that the sense signal continuously exceeds a predetermined threshold for a predetermined period of time. The first driver circuit and the second driver circuit may be capable of turning off the first gate signal and the second gate signal or may be capable of reducing a voltage level of the first and second gate signals in response to receiving an active fault signal.

The power switching assembly may include a specific port for outputting the fault signal to an external controller circuit, wherein the specific port may include a pad and/or a package lead. Alternatively or in addition, the power switching assembly may include a bidirectional port for receiving the low-level input signal and for outputting the fault signal.

According to another embodiment, the power switching assembly may include a first protection circuit and a second protection circuit, wherein the first protection circuit is configured to receive a first sense signal and output a first fault signal to the first driver circuit when the first sense signal indicates a fault condition, and wherein the second protection circuit is configured to receive a second sense signal and output a second fault signal to the second driver circuit when the second sense signal indicates a fault condition.

Each of the first and second sense signals may be a current sense signal, wherein a voltage level of the first sense signal is a function of a load current through the first power semiconductor switch, and a voltage level of the second sense signal is a function of a load current through the second power semiconductor switch. The first protection circuit may monitor the voltage level of the first sense signal and may change a voltage level of the first fault signal from an inactive level to an active level in case the first sense signal fulfils a predetermined condition. The second protection circuit may monitor the voltage level of the second sense signal and may change a voltage level of the second fault signal from an inactive level to an active level in case the second sense signal fulfils a predetermined condition. The predetermined condition may be that the respective sense signal continuously exceeds a predetermined threshold for a predetermined period of time.

According to another embodiment, the power switching assembly may further include a first power semiconductor switch including a first gate electrode configured to receive the first gate signal, and a second power semiconductor switch including a second gate electrode configured to receive the second gate signal, wherein load paths of the first power semiconductor switch and the second power semiconductor switch are electrically connected in parallel.

The first and second power semiconductor switches may be silicon MOSFETs, SiC-MOSFETs, IGBTs, or HEMTs, by way of example. The source/emitter pad of the first power semiconductor switch and the first reference node are electrically connected through a first low-ohmic connection. The source/emitter pad of the second power semiconductor switch and the second reference node are electrically connected through a second low-ohmic connection.

According to an embodiment, the first driver circuit, the second driver circuit, the first power semiconductor switch, and the second power semiconductor switch may be integrated in a single semiconductor package.

The semiconductor package may include a conductive base plate, wherein the first driver circuit, the second driver circuit, the first power semiconductor switch, and the second power semiconductor switch are mounted on, e.g., soldered onto a front side of the base plate. The semiconductor package may include conductive leads, wherein bond wires and/or metal clips electrically connect the first driver circuit, the second driver circuit, the first power semiconductor switch, and the second power semiconductor switch with the conductive leads. The first driver circuit and the second driver circuit may be integrated in a single semiconductor die. The first and second driver circuits may be formed in SOI (silicon-on-insulator) dies or in a single SOI die with a conductive back side film soldered onto the conductive base plate.

According to an example, the first power semiconductor switch and the second power semiconductor switch are vertical devices with a load current flow between a source/emitter pad at the front side and a conductive layer on a side opposite to the front side.

According to another example, the first power semiconductor switch and the second power semiconductor switch are lateral devices with a load current flow between a source/emitter pad at the front side and a drain/collector pad at the front side.

The power switching assembly may be integrated in a standard package with four or five terminals, e.g., a TO247-4 package or a QDPAK, and the assignment of the leads may be the same as in existing gate driver assemblies so that the power switching assembly can be used as a 1:1 replacement for existing gate driver assemblies.

In another aspect, a gate driver circuit may include a first driver circuit configured to drive a first gate signal and be supplied via a first internal supply node and a first reference node, and a second driver circuit configured to drive a second gate signal and be supplied via a second internal supply node and a second reference node, wherein the first gate signal and the second gate signal are in phase. The first reference node and the second reference node are separated. A first reference pad is electrically connected with the first reference node. A second reference pad is electrically connected with the second reference node.

For example, a first auxiliary bond wire connects the first reference pad with a source/emitter pad of a first power semiconductor switch, wherein the first auxiliary bond wire forms part of a Kelvin connection between the source/emitter pad of the first power semiconductor switch and the first reference node of the first driver circuit. The source/emitter pad may be the source pad of an MOSFET or HEMT, or the emitter pad of an IGBT. A second auxiliary bond wire connects the second reference pad with a source/emitter pad of a second power semiconductor switch, wherein the second auxiliary bond wire forms part of a Kelvin connection between the source/emitter pad of the second power semiconductor switch and the second reference node of the second driver circuit. The source/emitter pad may be the source pad of an MOSFET or HEMT, or the emitter pad of an IGBT.

According to an embodiment, the first driver circuit and the second driver circuit may be formed in laterally separated portions of a semiconductor layer formed on a planar front surface of an SOI insulator layer.

In particular, the gate driver circuit may be an SOI semiconductor die that includes at least an SOI insulator layer and a patterned semiconductor layer at a planar front side surface of the SOI insulator layer. The SOI semiconductor die may include a substrate layer on a side of the SOI insulator layer opposite the semiconductor layer.

If the SOI insulator layer provides sufficient strong vertical isolation between the front side with the semiconductor layer and the back side opposite the semiconductor layer, the gate driver circuit and the power semiconductor switches controlled by the gate driver circuit can be directly placed on the same base or heat slug, without the need of an additional pad.

According to an embodiment, the gate driver circuit may further include a first buffer capacitor electrically connected between the first internal supply node and the first reference node, and a second buffer capacitor electrically connected between the second internal supply node and the second reference node. Electrodes of at least one of the first buffer capacitor and the second buffer capacitor are formed on opposite sides of a deep trench isolator structure extending through the semiconductor layer.

The trench isolator structure may extend from a top surface of the semiconductor layer down to the SOI insulator layer. The trench isolator structure may form a frame, wherein a first electrode of the first buffer capacitor is formed in a portion of the semiconductor layer within the frame and a second electrode of the first buffer capacitor is formed in a portion of the semiconductor layer outside the frame.

In this way, the buffer capacitors can be fully integrated into the semiconductor die. Since the buffer capacitors supply the driver circuits only during signal transitions, the capacitance of the buffer capacitors can be comparatively low and the integration of the buffer capacitors into an SOI semiconductor die requires only a comparatively small chip area.

According to an embodiment, the gate driver circuit may further include a first gate signal control unit configured to control a steepness of transitions of the first gate signal in response to a detection signal received through a first feedback capacitance, wherein electrodes of the first feedback capacitance are formed on opposite sides of the SOI insulator layer.

For example, a first electrode of the first feedback capacitance may be formed in the semiconductor layer on the front surface of the SOI insulator layer and the second electrode may be formed on a surface of the SOI insulator layer opposite the front surface. In particular, the second electrode may include a conductive structure on which the SOI semiconductor die is bonded and/or soldered.

FIG. 1A shows a power switching assembly 90o that includes a gate driver circuit 100 and a power switch part 200.

The gate driver circuit 100 includes a first driver circuit 110, a second driver circuit 120, a first buffer capacitor 131, and a second buffer capacitor 132.

The first driver circuit no is supplied through a first supply voltage applied between a first internal supply node VDD1 and an internal first reference node VSS1 of the first driver circuit 110. The first internal supply node VDD1 and the first reference node VSS1 are internal network nodes of the gate driver circuit 100. The first driver circuit no receives a first input signal I1 and outputs a first gate signal G1, wherein a voltage level of the first gate signal G1 is a function of the voltage level of the first input signal I1.

The second driver circuit 120 is supplied through a second supply voltage applied between a second internal supply node VDD2 and an internal second reference node VSS2 of the second driver circuit 120. The second internal supply node VDD2 and the second reference node VSS2 are internal network nodes of the gate driver circuit 100. The second driver circuit 120 receives a second input signal I2 and outputs a second gate signal G2, wherein a voltage level of the second gate signal G2 is a function of the voltage level of the second input signal I2.

Each gate driver circuit 110, 120 may include a level shifter in combination with an amplifier circuit, wherein the level shifter may shift the voltage level of the low-level input signal I1, I2 to higher values, and wherein the amplifier circuit amplifies the level-shifted signal.

The first gate signal G1 and the second gate signal G2 are in phase. The first reference node VSS1 and the second reference node VSS2 are separated so that it is possible that the first reference node VSS1 and the second reference node VSS2 have different electrical potentials. The first internal supply node VDD1 and the second internal supply node VDD2 are separated so that it is possible that the first internal supply node VDD1 and the second internal supply node VDD2 have different electrical potentials.

The first buffer capacitor 131 is electrically connected between the first internal supply node VDD1 and the first reference node VSS1. The second buffer capacitor 132 is electrically connected between the second internal supply node VDD2 and the second reference node VSS2.

The power switch pall 200 includes a first load terminal LT1, a second load terminal LT2, a first power semiconductor switch 210 and a second power semiconductor switch 220, wherein load paths of the first power semiconductor switch 210 and the second power semiconductor switch 220 are electrically connected in parallel between the first load terminal LT1 and the second load terminal LT2.

Each of the first and second power semiconductor switches 210, 220 is or includes a silicon MOSFET, an SiC-MOSFET, an IGBT, or a HEMT, wherein a controlled load path of the first power semiconductor switch 210 is between a first drain/collector electrode DC1 and a first source/emitter pad SE1 of the first power semiconductor switch 210, and wherein a controlled load path of the second power semiconductor switch 220 is between a second drain/collector electrode DC2 and a second source/emitter pad SE2 of the second power semiconductor switch 220.

The power switch part 200 further includes a first load wiring 231 with a first parasitic inductance L1 between the first source/emitter pad SE1 and the first load terminal LT1, and a second load wiring 232 with a second parasitic inductance L2 between the second source/emitter pad SE2 and the first load terminal LT1. The first drain/collector electrode DC1 and the second drain/collector electrode DC2 may form or may be directly connected to the second load terminal LT2.

The output of the first driver circuit no is electrically connected to a gate of the first power semiconductor switch 210 through a first gate connection that may include a bond wire or a metal clip, wherein the gate of the first power semiconductor switch 210 receives the first gate signal G1 output by the first driver circuit 210. The output of the second driver circuit 120 is electrically connected to a gate of the second power semiconductor switch 220 through a second gate connection that may include a bond wire or a metal clip, wherein the gate of the second power semiconductor switch 220 receives the second gate signal G2 output by the second driver circuit 220.

The first source/emitter pad SE1 and the first reference node VSS1 of the first driver circuit no are electrically connected through an ohmic, low-resistive connection that may include a bond wire or a metal clip. The second source/emitter pad SE2 and the second reference node VSS2 of the second driver circuit 120 are electrically connected through another ohmic, low-resistive connection that may include a bond wire or a metal clip.

Each driver circuit 110, 120 receives a low-level input signal I1, I2 and produces a high-current gate signal G1, G2 for the gate of the power semiconductor switch 210, 220 connected to the respective driver circuit 110, 120.

Figure 1B:
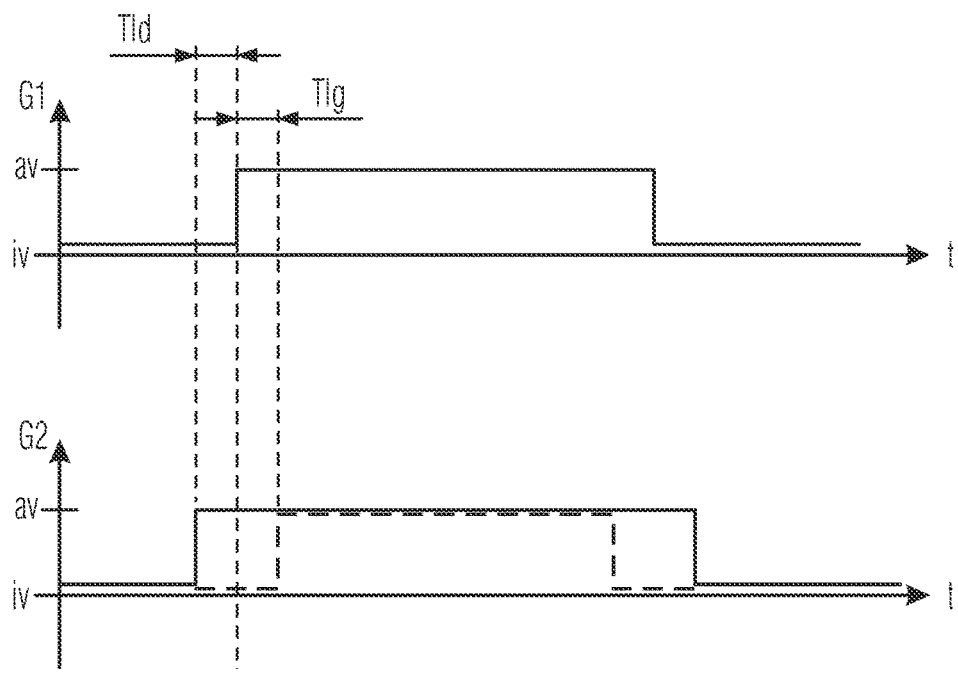

As illustrated in FIG. 1B, each of the first gate signal G1 and the second gate signal G2 alternate a voltage level between an active level av for turning on the power semiconductor switches 210, 220 and an inactive level iv for turning off the power semiconductor switches 210, 220. The first and second driver circuits 110, 120 provide both the active level av and the inactive level iv with an output current large enough to charge and discharge the gate capacitance of the power semiconductor switches 210, 220 sufficiently fast.

The first gate signal G1 and the second gate signal G2 are in phase and change the voltage levels at the same frequency in the same direction from the inactive level iv to the active level av and from the active level av to the inactive level iv such that the second gate signal G2 is primarily or exclusively active when the first gate signal G1 is active and the second gate signal G2 is primarily or exclusively inactive when the first gate signal G1 is inactive. A transition of the second gate signal G2 from the inactive level iv to the active level av may be synchronous with a transition of the first gate signal G1 from the inactive level iv to the active level av, may precede the transition of the first gate signal G1 from the inactive level iv to the active level av by a lead time Tld, or may lag the transition of the first gate signal G1 from the inactive level iv to the active level av by a lag time Tlg.

The load currents ILD1, ILD2 through the first and second power semiconductor switches 210, 220 may be different and/or the first and second parasitic inductances L1, L2 may be different, the latter e.g. due to different lengths of the first and second load wirings 231, 232. In the switching phases of the power switching assembly 900, different transient voltage USE1=L1*dILD1/dt, USE2=L2*dILD2/dt occur across the first and second parasitic inductances L1, L2.

In the absence of any electric connection between the first and second source/emitter pads SE1, SE2 and the first and second reference nodes VSS1, VSS2, the transient voltages would significantly change the effective voltages of both the first and the second gate signals G1, G2, and the transient voltages would affect the effective voltages of the first and the second gate signals G1, G2 differently.

For single-switch configurations, typically a Kelvin connection between the source or emitter pad of the single switch and the reference of the driver circuit provides an independent feedback path for eliminating the effect of the voltage drop across the parasitic source wiring or emitter wiring on the effective gate voltage level.

For configurations with two or more power semiconductor switches with the load paths electrically connected in parallel, a Kelvin connection can typically only be provided for one of the power semiconductor switches, since otherwise a current loop over the Kelvin connections forms parallel to the current loop over the load contacts, and a comparatively high compensation current may flow through the comparatively narrow Kelvin connections. An overload of the Kelvin connections may be mitigated by down rating the used power semiconductor switches for lower switching frequencies and/or lower load currents.

In the power switching assembly 900 of FIG. 1A on the other hand, the first and second buffer capacitors 131, 132 enable independent and low-current gate drive loops for each of the power semiconductor switches 210, 220. With the first and second buffer capacitors 131, 132 it becomes possible to design the first and second driver circuits 110, 120 in a way that the potential of the first and second internal supply nodes VDD1, VDD2 follow voltage fluctuations on the first and second source/emitter pads SE1, SE2 independently from each other. Kelvin connections can be provided between the first reference node VSS1 and the first source/emitter pad SE1, and between the second reference node VSS2 and the second source/emitter pad SE2 without provoking a compensation current in the Kelvin connections. Each power semiconductor switch 210, 220 can be driven with the designed gate voltage and thus the switching in the power switch part 200 is symmetric.

The potentials of the first and second internal supply nodes VDD1, VDD2 follow voltage fluctuations on the first and second source/emitter pads SE1, SE2 independently from each other, so that for each gate driver circuit 110, 120 separately, the output gate voltage can be controlled to be independent from a transient voltage drop across the parasitic inductance in the source or emitter wiring. No possibly harmful compensation currents flow in the gate drive loops.

The power switching assembly 900 may include more than two gate driver circuits 110, 120, wherein to each gate driver circuit 1*xo* a separate buffer capacitor 13*x* is electrically connected between the internal supply node VDDx of the concerned gate driver circuit 1*xo* and the reference node VSSx of the concerned gate driver circuit 1*xo*.

Figure 2:
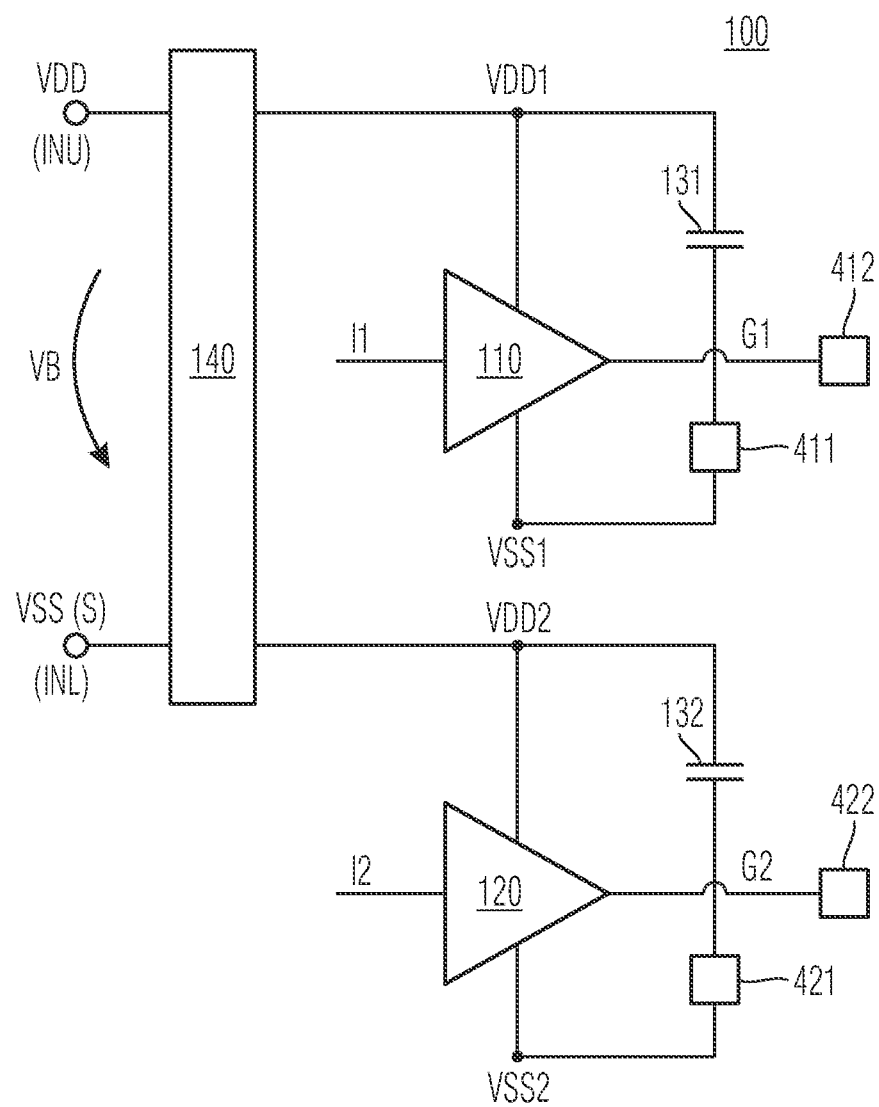
FIG. 2 is a schematic circuit diagram of a gate driver circuit with two driver circuits according to an embodiment.

FIG. 2 shows a gate driver circuit 100 with a first reference pad 411, a second reference pad 421, a first gate output pad 412, a second gate output pad 422 and a charging circuit 140.

The first reference node VSS1 is electrically connected to the first reference pad 411. The second reference node VSS2 is electrically connected to the second reference pad 421. The output of the first driver circuit no is electrically connected to the first gate output pad 412. The output of the second driver circuit 120 is electrically connected to the second gate output pad 422.

The first reference pad 411 and the first gate output pad 412 are formed at a front side of a semiconductor die including the first driver circuit 110. The second reference pad 421 and the second gate output pad 422 are formed at a front side of a semiconductor die including the second driver circuit 110. Alternatively, the first reference pad 411, the second reference pad 421, the first gate output pad 412, and the second gate output pad 422 are formed at a front side of a single semiconductor die that includes both the first driver circuit no and the second driver circuit 120.

The charging circuit 140 receives an operating voltage VB applied between a first charging circuit input and a second charging circuit input. The operating voltage VB can be a constant voltage, wherein a positive supply potential is applied to the first charging circuit input and a negative supply potential is applied to the second charging circuit input, or a square wave signal applied between the first and second charging circuit inputs.

For each of the driver circuits 110, 120, the charging circuit 140 charges the buffer capacitor 131, 132 from the operating voltage VB in a first mode and decouples a voltage source supplying the operating voltage VB from the potential across the buffer capacitor 131, 132 in a second mode.

For each of the driver circuits 110, 120, the charging circuit 140 is in the first mode during the static portions of a switching cycle when almost no current flows to or from the gate of the concerned power semiconductor switch 210, 220 and when the load current of the power semiconductor switch 210, 220 has almost reached the end value in a switching cycle. In the first mode, the charging circuit 140 connects the voltage supply providing the constant or toggling operating voltage VB to the buffer capacitor 131, 132 in a way that the voltage supply charges the buffer capacitor 131, 132.

For each of the driver circuits 110, 120 separately, the charging circuit 140 can change to the second mode, when during phases of current transients across the load wiring between the source/emitter pads SE1, SE2 and the first load terminal LT1 in the power switch part 200 of FIG. 1A the potential at the reference node VSS1, VSS2 rises and transforms into an increase of the potential at the internal supply node VDD1, VDD2 to above the higher potential at the inputs of the charging circuit 140. In this case, the charging circuit 140 prevents the respective buffer capacitor 131, 132 from being discharged via the voltage source supplying the operating voltage VB in the second mode.

Figure 3:
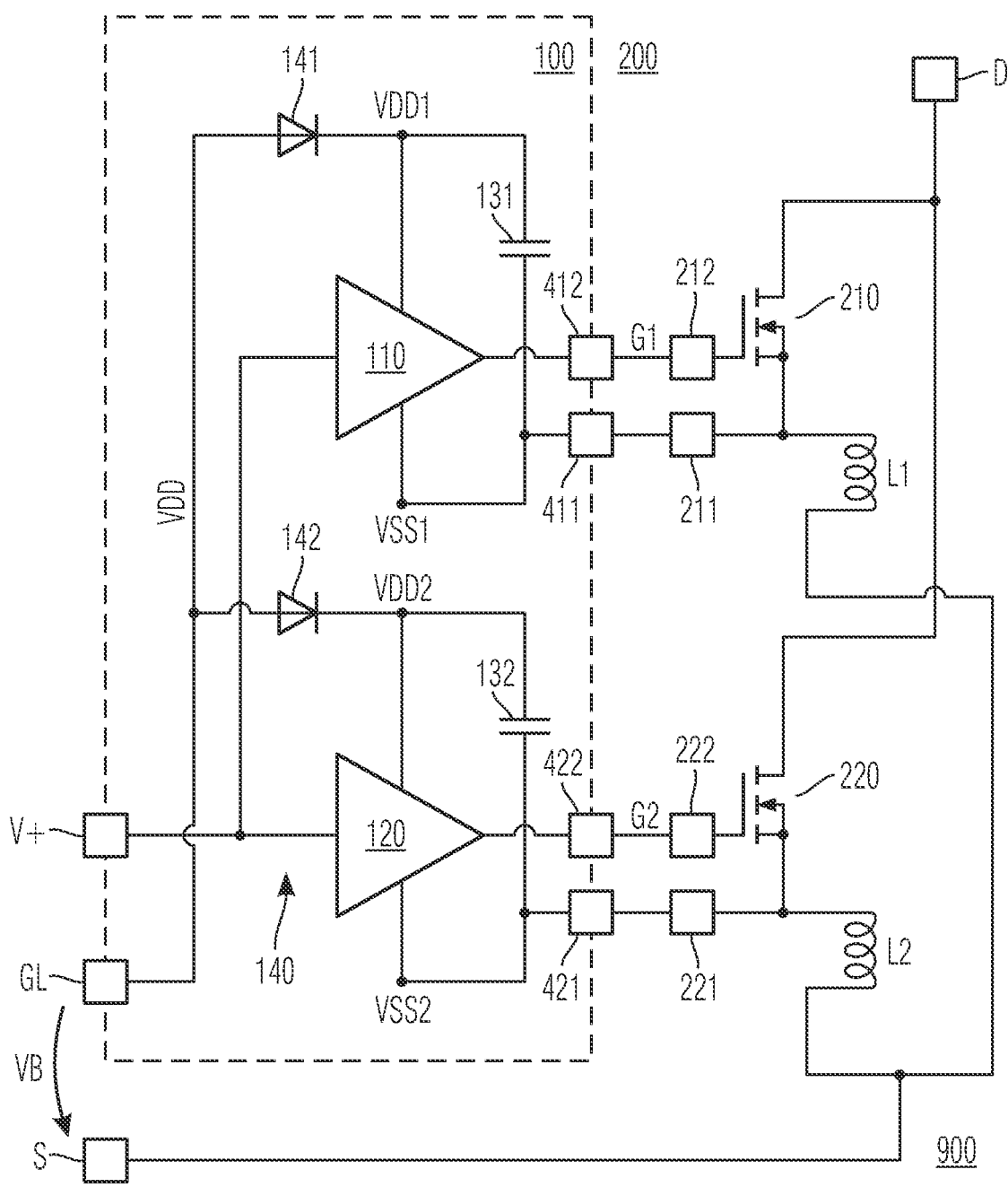
FIG. 3 is a schematic circuit diagram of a power switching assembly according to an embodiment with two semiconductor switches electrically connected in parallel and a gate driver circuit with two driver circuits.

FIG. 3 shows another example of a power switching assembly 900 with a gate driver circuit 100 and a power switch part 200.

The power switch part 200 includes a first MOSFET as the first power semiconductor switch 210 and a second MOSFET as the second power semiconductor switch 220. The first and second MOSFETs 210, 220 may be based on a wide band gap semiconductor material, e.g., silicon carbide, wherein the first and second MOSFETs are SiC MOSFETs. Alternatively, the first and second power semiconductor switches 210 may be HEMTs based on gallium nitride GaN. The first and second MOSFETs 210, 220 are connected in parallel between a source lead S as the first load terminal of the power switching assembly 900 and a drain lead D as the second load terminal of the power switching assembly 900.

A first source pad 211 and a first gate pad 212 are formed on a front side of the first MOSFET 210. A second source pad 221 and a second gate pad 222 are formed directly on a front side of the second MOSFET 210.

The gate driver circuit 100 includes a charging circuit 140 with charging diodes 141, 142. A first charging diode 141 is electrically connected in forward direction between a positive supply port V+ and the first internal supply node VDD1. A second charging diode 142 is electrically connected in forward direction between the positive supply port V+ and the second internal supply node VDD2.

The positive supply port V+ may include a pad and/or a package lead. The operating voltage VB is applied between the positive supply port V+ and the source lead S, charges the first buffer capacitor 131 through the first charging diode 141 as long as the potential at the first internal supply node VDD1 is lower than the potential at the positive supply port V+, and charges the second buffer capacitor 132 through the second charging diode 142 as long as the potential at the second internal supply node VDD2 is lower than the potential at the positive supply port V+. The blocking function of the first charging diode 141 ensures that the potential at the first internal supply node VDD1 can rise accordingly when the potential at the first reference node VSS1 rises as a result of a sharply increasing or decreasing load current through the first parasitic inductance L1. The blocking function of the second charging diode 142 ensures that the potential at the second internal supply node VDD1 can rise accordingly when the potential at the second reference node VSS2 rises as a result of a sharply increasing or decreasing load current through the second parasitic inductance L2.

Wiring connections connect the first gate output pad 412 of the gate driver circuit 100 and the first gate pad 212 of the first MOSFET 210, the first reference pad 411 and the first source pad 211 of the first MOSFET 210, the second gate output pad 422 and the second gate pad 222 of the second MOSFET 220, and the second reference pad 421 and the second source pad 221 of the second MOSFET 220.

The power switching assembly further includes a control port GL. The control port GL can be a unidirectional input port at which the gate driver circuit 100 receives a control signal CI. The control signal CI is a square signal applied between the control port GL and the source lead S. The control signal CI is passed to the input of the first driver circuit no as the first input signal I1 and to the input of the second driver circuit 120 as the second input signal I2.

The first driver circuit no receives, level-shifts and current amplifies the first input signal I1 to obtain and drive the first gate signal G1 for the first MOSFET 210. The second driver circuit 120 receives, level-shifts and current amplifies the second input signal I2 to obtain and output the second gate signal G2 for the second MOSFET 220.

Figure 4:
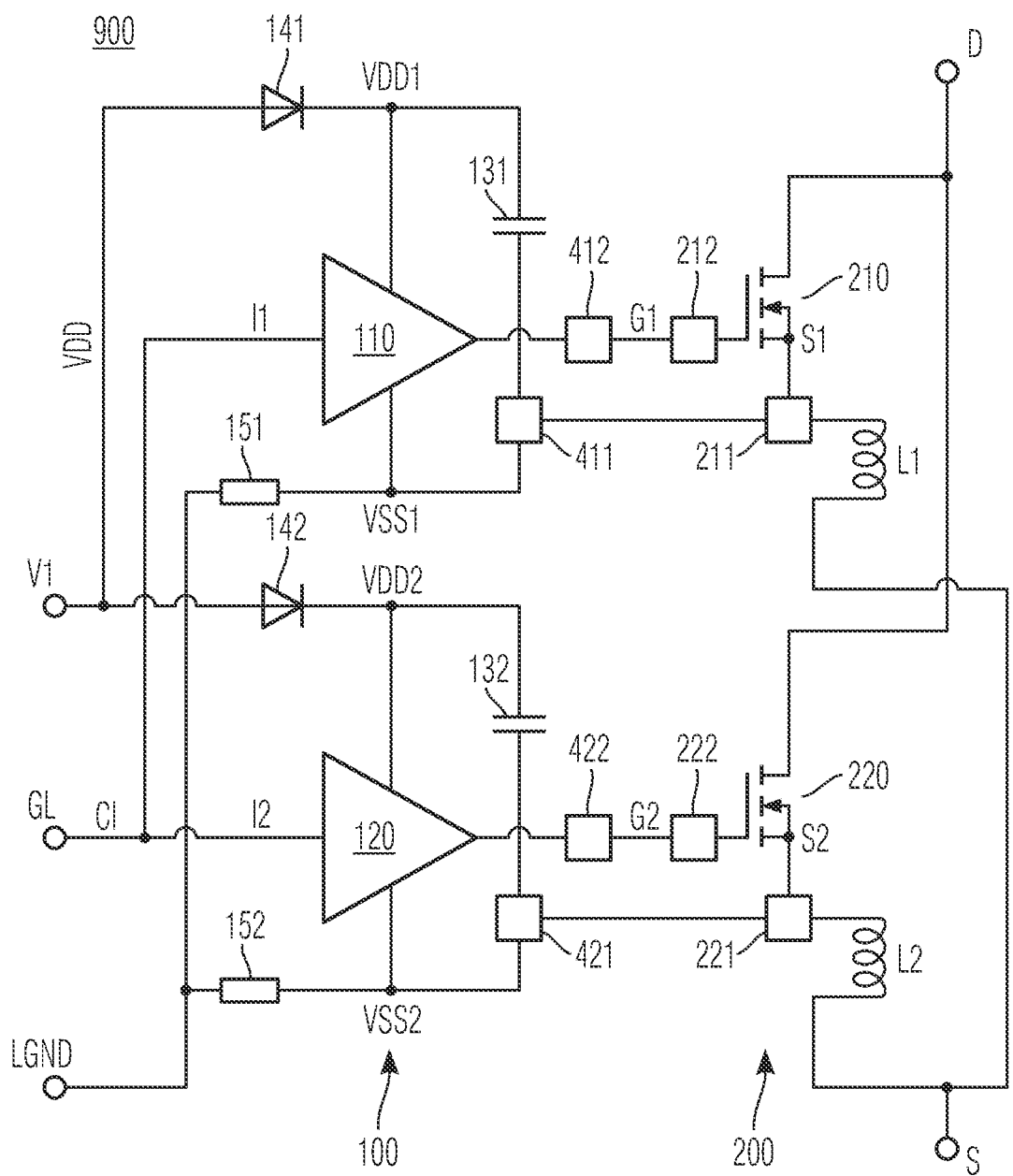
FIG. 4 is a schematic circuit diagram of a power switching assembly according to an embodiment with two semiconductor switches electrically connected in parallel and a gate driver circuit with two driver circuits and a logic ground terminal.

In FIG. 4 the gate driver circuit 100 includes a signal ground port LGND. The signal ground port LGND may include a pad and/or a package lead. A first current limiting resistor 151 is electrically connected between the signal ground port LGND and the first reference node VSS1. A second current limiting resistor 152 is electrically connected between the signal ground port LGND and the second reference node VSS2.

The control signal CI is applied between the control port GL and the signal ground port LGND. With the separated signal ground port LGND, it is possible to decouple to some degree the reference potential of the control signal CI and the input signals I1, I2 from disturbances on the source conductors in the power switch part 200. The current limiting resistors 151, 152 attenuate possible loop currents between the source electrodes S1, S2 of the first and second MOSFETs 210, 220 through the connections between the first and second reference pads 411, 421 in the gate driver circuit 100.

Figure 5:
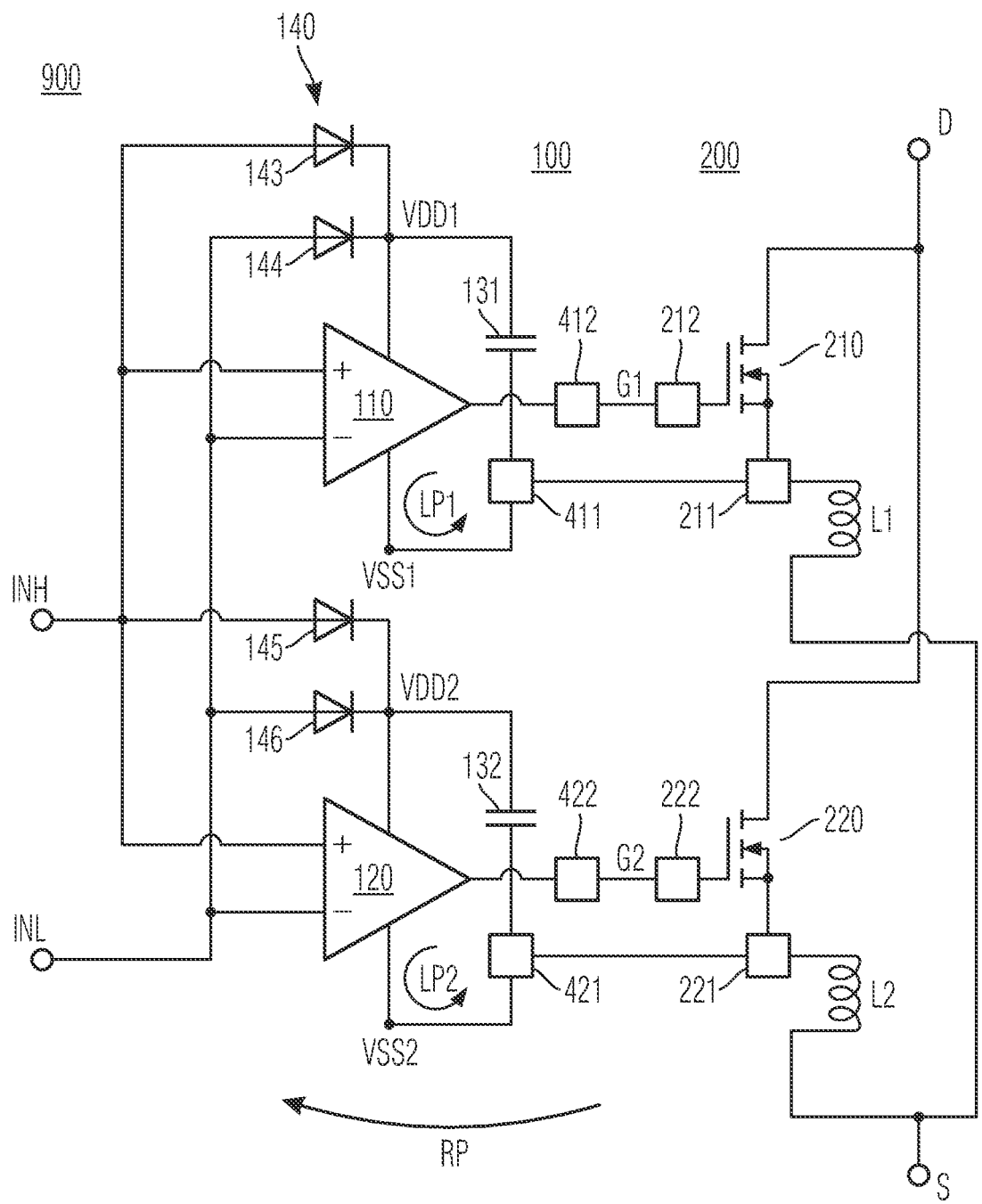
FIG. 5 is a schematic circuit diagram of a power switching assembly according to an embodiment with two semiconductor switches electrically connected in parallel and a gate driver circuit with two driver circuits and four supply diodes.

FIG. 5 shows a power switching assembly 900 with a gate driver circuit 100 having a first differential port INH and a second differential port INL. Each of the first and second differential porta INH, INL may include a pad and/or a package lead. The first and second differential ports INH, INL are connected to differential inputs of the first driver circuit 110 and to differential inputs of the second driver circuit 120.

The charging circuit 140 includes a first supply diode 143 electrically connected in forward direction between the first differential port INH and the first internal supply node VDD1, a second supply diode 144 electrically connected in forward direction between the second differential port INL and the first internal supply node VDD1, a third supply diode 145 electrically connected in forward direction between the first differential port INH and the second internal supply node VDD2, and a fourth supply diode 146 electrically connected in forward direction between the second differential port INL and the second internal supply node VDD2. A differential signal applied between the first differential port INH and the second differential port INL is provided to deliver sufficient power to charge the first and second buffer capacitors 131, 132 in order to supply the first and second driver circuits 110, 120. In particular, the potentials at the first and second differential ports INH, INL are selected to provide the voltage span required to sufficiently supply the driver circuits 210, 220 and the gates of the first and second MOSFETs 210, 220.

In addition, the first driver circuit 110 obtains the first gate signal G1 from the differential signal applied between the first differential port INH and the second differential port INL, and the second driver circuit 120 obtains the second gate signal G2 from the differential signal applied between the first differential port INH and the second differential port INL. The sign of the differential signal determines the status of the gate driver circuit boo.

When the potential at the first differential port INH becomes higher than the potential at the second differential port INL, the driver circuits 110, 120 turn on and charge is transferred from the first and second buffer capacitors 131, 132 to the gates of the first and second MOSFETs 210, 220. Transient currents flow between the first buffer capacitor 131 and the first MOSFET 210 mainly in a first local loop LP1 without interaction with the first parasitic inductance L1, and between the second buffer capacitor 132 and the second MOSFET 220 mainly in a second local loop LP2 without interaction with the second parasitic inductance L2.

When the potential at the first differential port INH becomes lower than the potential at the second differential port INL, the driver circuits 110, 120 turn OFF and discharge the gates of the first and second MOSFETs 210, 220 via the first local loop LP1 without interaction with the first parasitic inductance L1, and via the second local loop LP2 without interaction with the second parasitic inductance L2.

In the on state of the driver circuits 110, 120, the higher potential at the first differential port INH charges the first buffer capacitor 131 through the first supply diode 143 and the second buffer capacitor 132 through the third supply diode 145. In the off state of the driver circuits 110, 120, the higher potential at the second differential port INL charges the first buffer capacitor 131 through the second supply diode 144 and the second buffer capacitor 132 through the fourth supply diode 144. For both the static on state and the static off state, a recharge path RP closes across the parasitic inductances L1, L2, the source lead S and the external driver circuit driving the potentials at the first and second differential ports INH, INL with reference to the potential at the source lead S.

Any voltage difference developing between the first and second reference nodes VSS1, VSS2 due to asymmetries in the load paths of the first and second MOSFETs 210, 220 remains without significant impact on the effective gate voltage of the first and second MOSFETs 210, 220 but effects only the external driver providing the differential signal for the first and second differential ports INH, INL. Thus, by using a differential signal as signal input and supply for the driver circuits 110, 120, it is possible to reduce or eliminate the effect of different voltage transients in the two parallel load paths in the power switch part 200 on the effective input gate voltages of the first and second MOSFETs 210, 220, even without an ohmic connection between the first reference node VSS1 and the second reference node VSS2.

By integrating the first and second driver circuits 110, 120 in a common SOI device, active areas of the first and second driver circuits 110, 120 can be formed completely separated from each other apart from the common input signals, so that for each of the first and second driver circuits 210, 220, the amount of voltage needed from changing from the on state to the off state and from the off state to the on state can be as high as the supply voltage.

Figure 6:
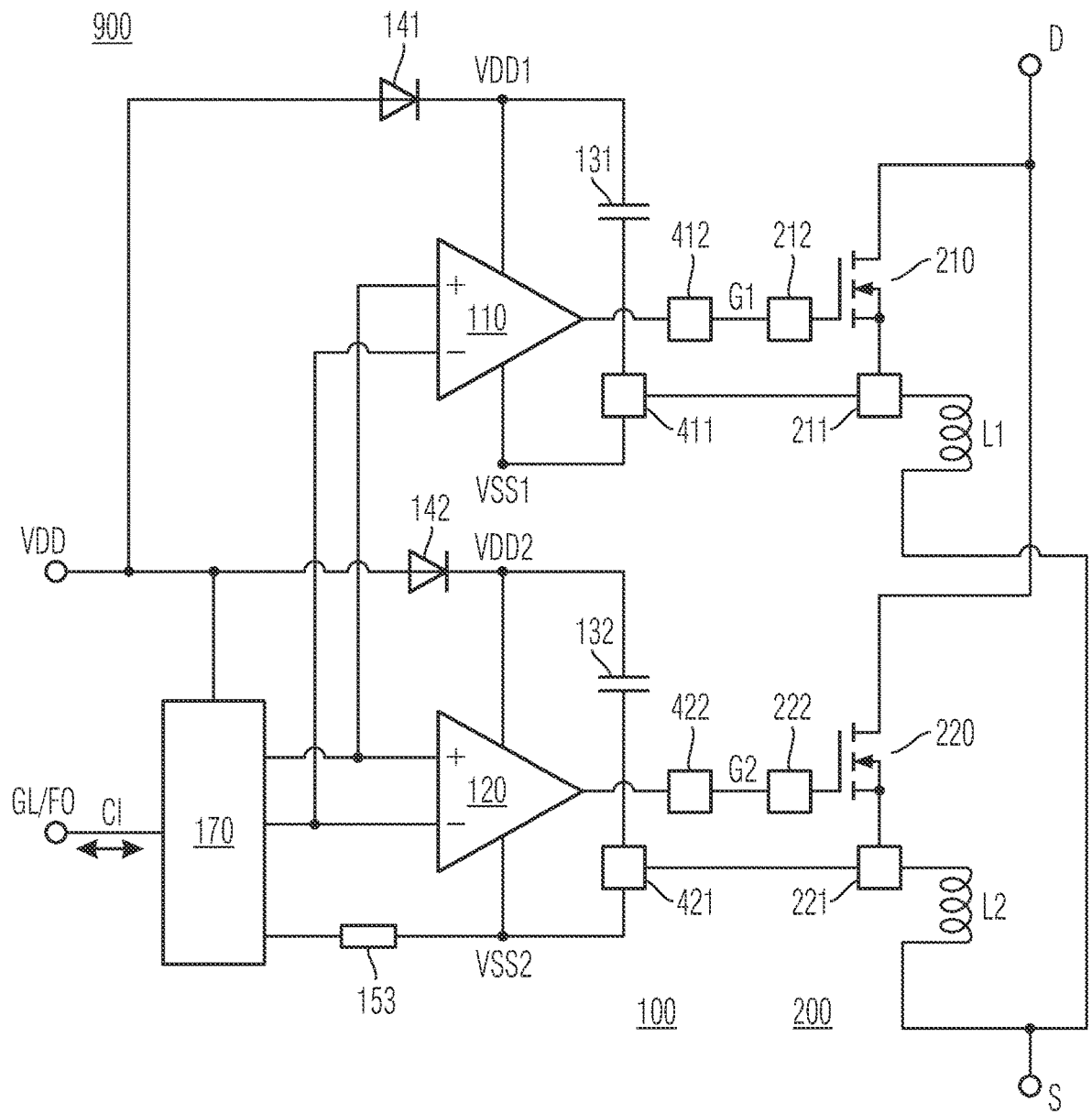
FIG. 6 is a schematic circuit diagram of a power switching assembly according to an embodiment with two semiconductor switches electrically connected in parallel and a gate driver circuit with two driver circuits and a differentiator circuit.

The gate driver circuit 100 in FIG. 6 includes a charging circuit 140 with a first charging diode 141 charging the first buffer capacitor 131 via a positive supply port V+ and a second charging diode 142 charging the second buffer capacitor 132 via the positive supply port V+. A first Kelvin connection connects the source of the first MOSFET 210 with the first reference node VSS1 of the first driver circuit 110. A separate, second Kelvin connection connects the source of the second MOSFET 220 with the second reference node VSS2 of the second driver circuit 120.

The control port GL is electrically connected to an input of a differentiator circuit 170. The differentiator circuit 170 is supplied through the positive supply port V+ and the source lead S, wherein the gate driver circuit 100 includes a third current limiting resistor 153 electrically connected between the differentiator circuit 170 and the first or second reference node VSS1, VSS2 to attenuate the current flow to and/or from the differentiator circuit 170.

From a square control signal CI applied to the control port GL, the differentiator circuit 170 obtains a differential input signal and passes the differential input signal to the differential input of the first driver circuit 110 and to the differential input of the second driver circuit 120. By providing a differential input signal, the differentiator circuit 170 decouples to some degree the control of the first and second driver circuits 110, 120 from disturbances on the source wiring of the power switch part 200, without requiring an individual signal ground port LGND.

The control port GL may be a unidirectional input port or a bidirectional port for both receiving the control signal CI and outputting a fault signal and/or monitoring signal generated in the power switching assembly 900.

Figure 7:
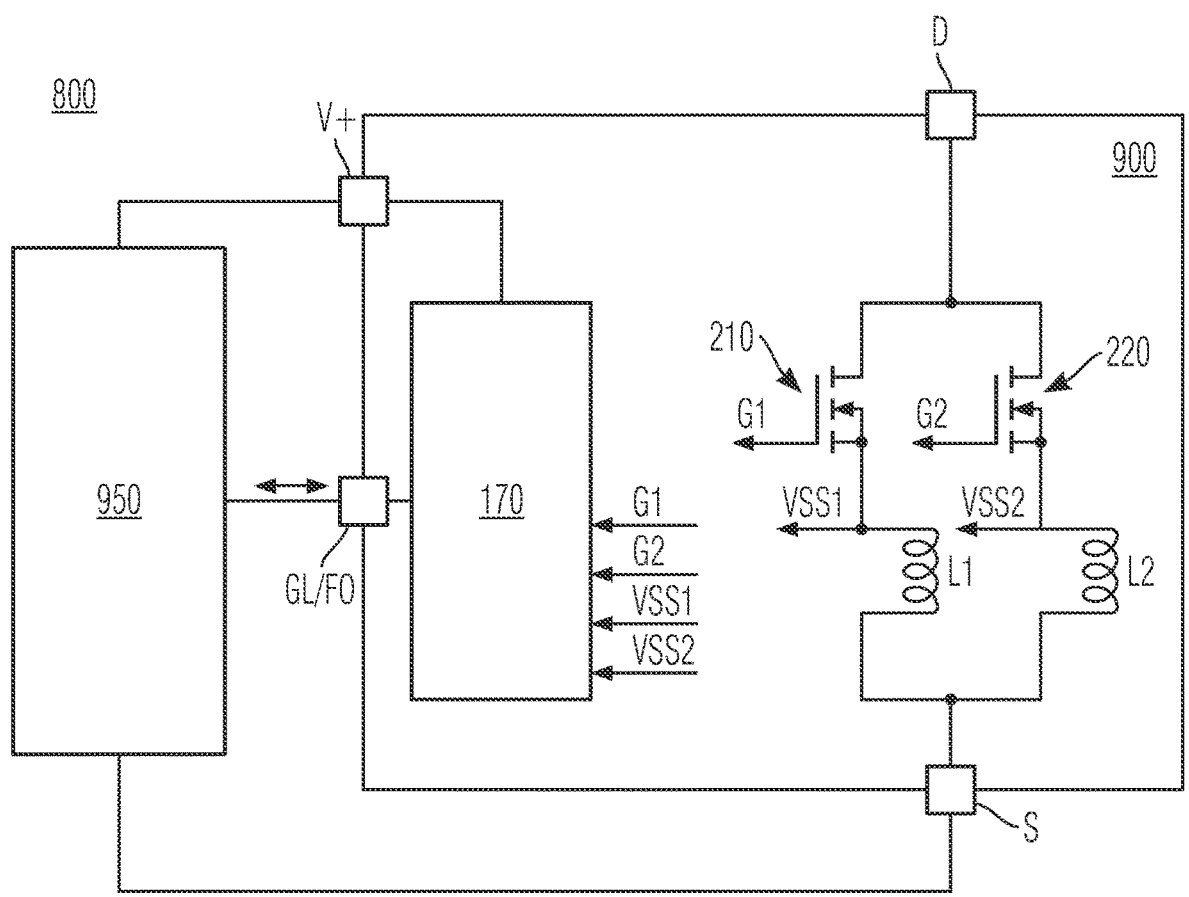
FIG. 7 is a schematic circuit diagram of a power switching system according to an embodiment with two semiconductor switches electrically connected in parallel, a gate driver circuit having two driver circuits, and a master circuit.

FIG. 7 shows a power switching system 800 with a digital communication line 870 established between a master circuit 850 and the differentiator circuit 170 of the power switching assembly 900 of FIG. 6. The master circuit 850 is a transceiver circuit that receives a control signal from a further instance and forwards a square control signal to the bidirectional control port GL of the power switching assembly 900. Alternatively, the master circuit 850 is a microcontroller that generates and outputs a control signal. The master circuit 850 receives a fault signal output by the gate driver circuit 100 through the bidirectional control port GL. The reverse path for signals transmitted on the digital communication line 870 closes through a low resistive, ohmic connection between the master circuit 850 and the source lead S. The control signal CI can be a signal of the ON/OFF signal type with two or more different signal levels.

The differentiator circuit 170 decouples to some extent the requirements for the control signal from the requirements for the gate signals G1, G2. A voltage range for the control signal can be defined independently from the switching characteristics of the first and second power semiconductor switches 210, 220. The threshold for the control signal can be adapted to the requirements at the side of the master circuit 850. The signals transmitted on the digital communication line 870 can be more complex and can assume more than two differently defined signal levels.

In particular, the master circuit 850 and the differentiator circuit 170 establish a master/slave single-wire bidirectional communication protocol with the master circuit 850 representing the master and the differentiator circuit 170 representing the slave, wherein in addition to deliver the control signals for the power switch part 200, the master circuit 850 can control a dV/dt target value, an overcurrent protection threshold, and/or a overtemperature protection threshold. The power switching assembly 200 can transmit status information that includes diagnostic information about over-temperature status and/or overcurrent status and/or operating information about the current temperature and/or the current load current delivered by the power switch part 200. The master circuit 850 and the differentiator circuit 170 may use voltage levels for one of the communications directions and current levels for the other communications directions.

Figure 8:
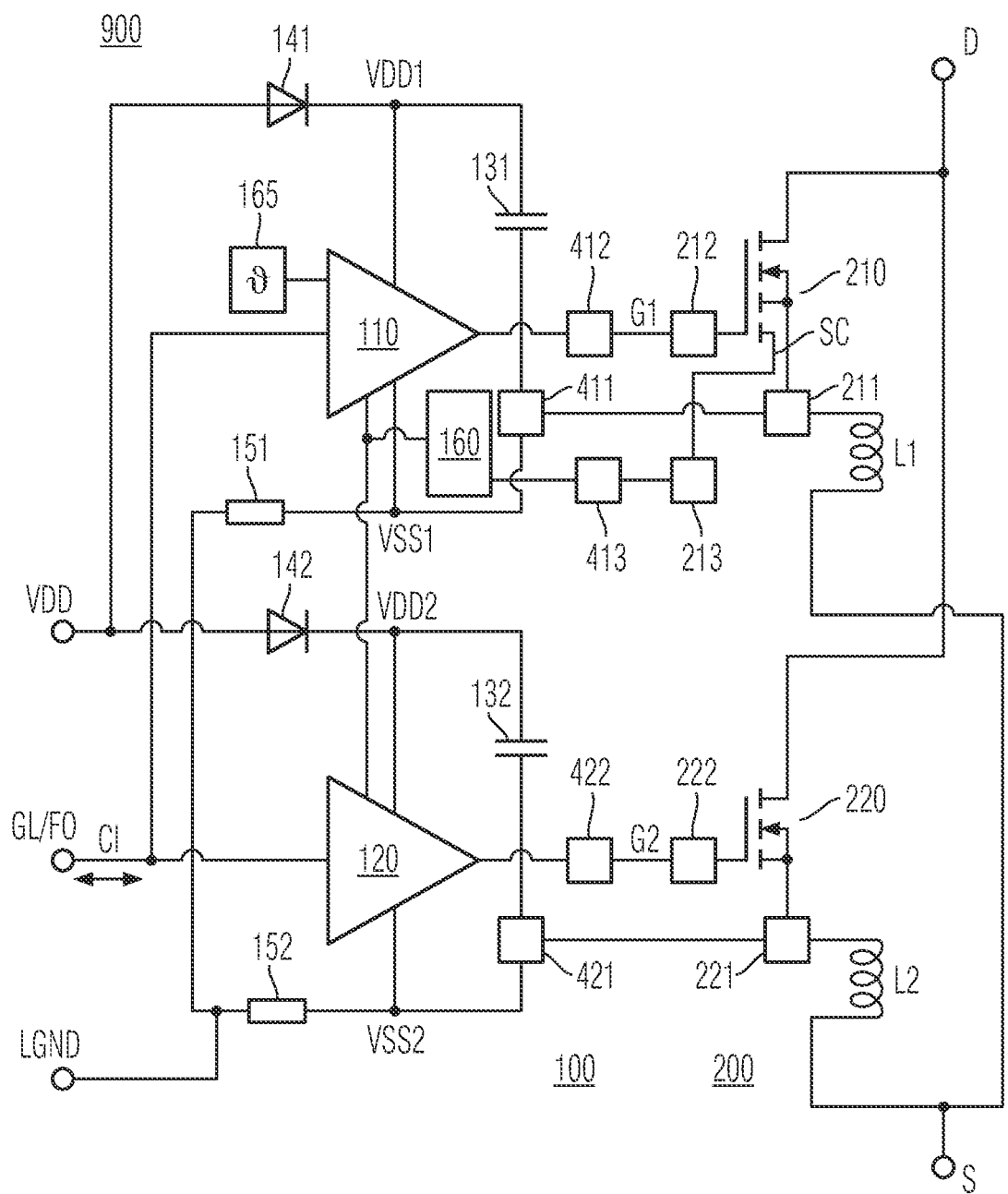
FIG. 8 is a schematic circuit diagram of a power switching assembly according to an embodiment with two semiconductor switches electrically connected in parallel and a gate driver circuit including two driver circuits and two current limiting resistors.

In FIG. 8, the first power semiconductor switch 210 includes a sense cell SC. An output of the sense cell SC is electrically connected to a sense pad 213 at a front side of the first semiconductor switch 210. A sense input pad 413 is formed at a front side of the gate driver circuit 100. A wiring connection, e.g., a bond wire connects the sense input pad 413 and the sense pad 213. An input of a protection circuit 160 is electrically connected to the sense input pad 413. The protection circuit 160 outputs a fault signal at a fault output. The fault output is electrically connected with the first and second driver circuits 110, 120.

The sense cell SC outputs a sense signal. The sense signal may be a current signal or a voltage signal, wherein an amplitude of the sense signal is a function of a junction temperature of and/or a load current through the first power semiconductor switch 210. The protection circuit 160 monitors the amplitude of the sense signal and changes a voltage level of the fault signal from an inactive level to an active level in case the sense signal continuously exceeds or falls below a predetermined threshold for a predetermined period of time.

The first and second driver circuits 110, 120 turn off the first and second gate signals G1, G2 or may reduce a voltage level of the first and second gate signals G1, G2 in response to receiving an active fault signal.

The gate driver circuit boo and the power semiconductor switches 210, 220 are attached to the same base in close lateral vicinity to each other, for example, side-by-side on the same section of a lead frame.

The gate driver circuit 100 further includes a temperature monitoring circuit 165. The temperature monitoring circuit 165 monitors switch temperatures and temperature transients. The temperature monitoring circuit 165 outputs an active monitoring signal in case the monitored temperatures and/or temperature transients fulfil a predetermined condition.

The control port GL is a bidirectional port for both receiving the control signal CI and outputting the fault signal and/or monitoring signal, wherein at least one of the driver circuits 110, 120 is capable of pulling the potential at and/or a current through the control port GL to predefined signal levels.

Alternatively or in addition, the power switching assembly 900 may include a specific port for outputting the fault signal and/or monitoring signal to an external controller circuit, wherein the specific port may include a pad and/or a package lead.

Figure 9:
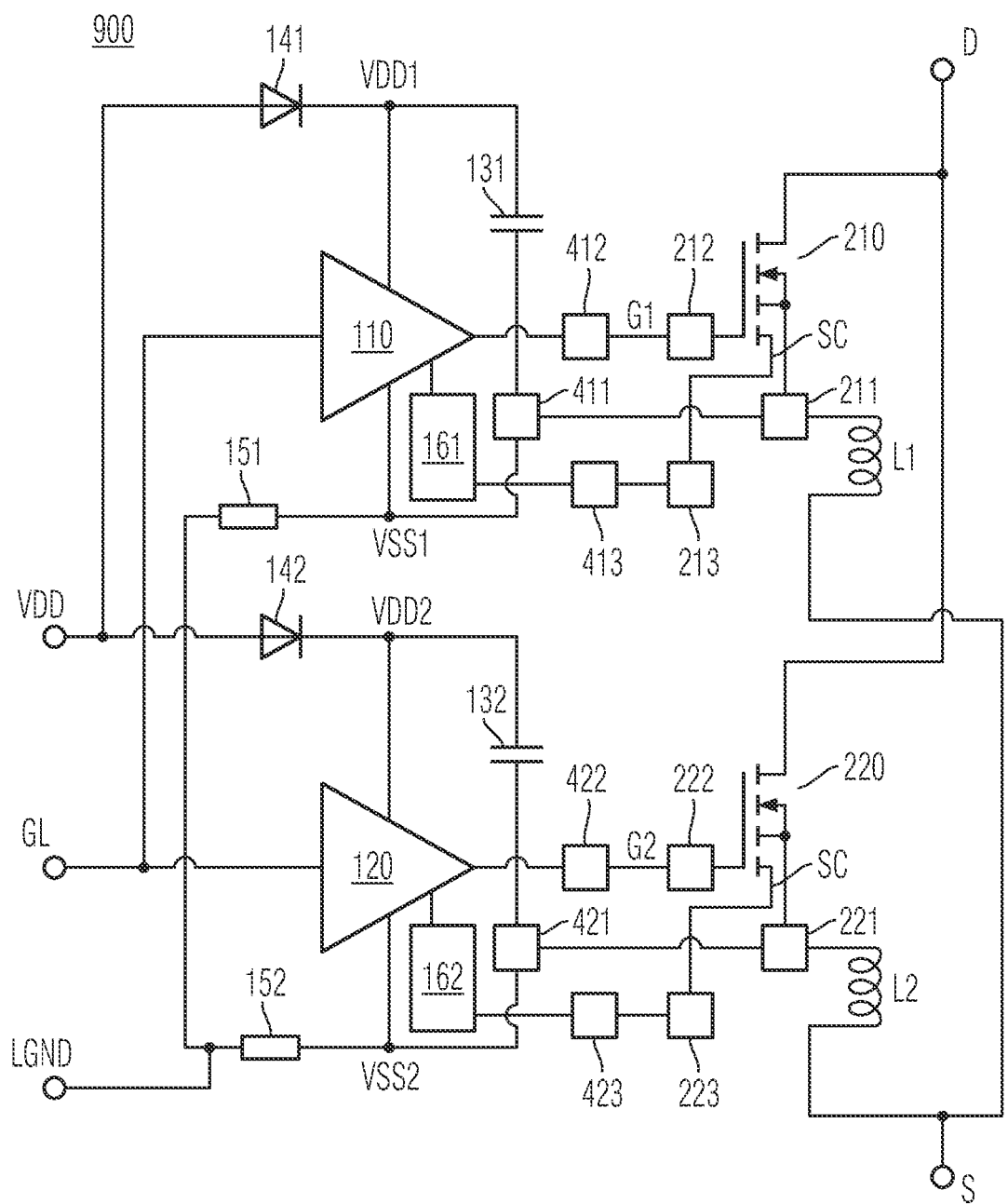
FIG. 9 is a schematic circuit diagram of a power switching assembly according to an embodiment with two semiconductor switches electrically connected in parallel and a gate driver circuit including two driver circuits and two separate protection circuits.

In FIG. 9, each of the power semiconductor switches 210, 220 includes a sense cell SC.

The sense cell SC of the first power semiconductor switch 210 outputs a first sense signal that is passed through the sense pad of the first power semiconductor switch 210 and the sense input pad 413 for the first driver circuit no to a first protection circuit 161. The first protection circuit 161 outputs a first fault signal that is passed to the first driver circuit 110. An active first fault signal turns off the first driver circuit 110.

The sense cell SC of the second power semiconductor switch 220 outputs a second sense signal that is passed through the sense pad of the second power semiconductor switch 210 and the sense input pad 423 assigned to the second driver circuit 120 to a second protection circuit 162. The second protection circuit 162 outputs a second fault signal that is passed to the second driver circuit 120. An active second fault signal turns off the second driver circuit 120.

Figure 10:
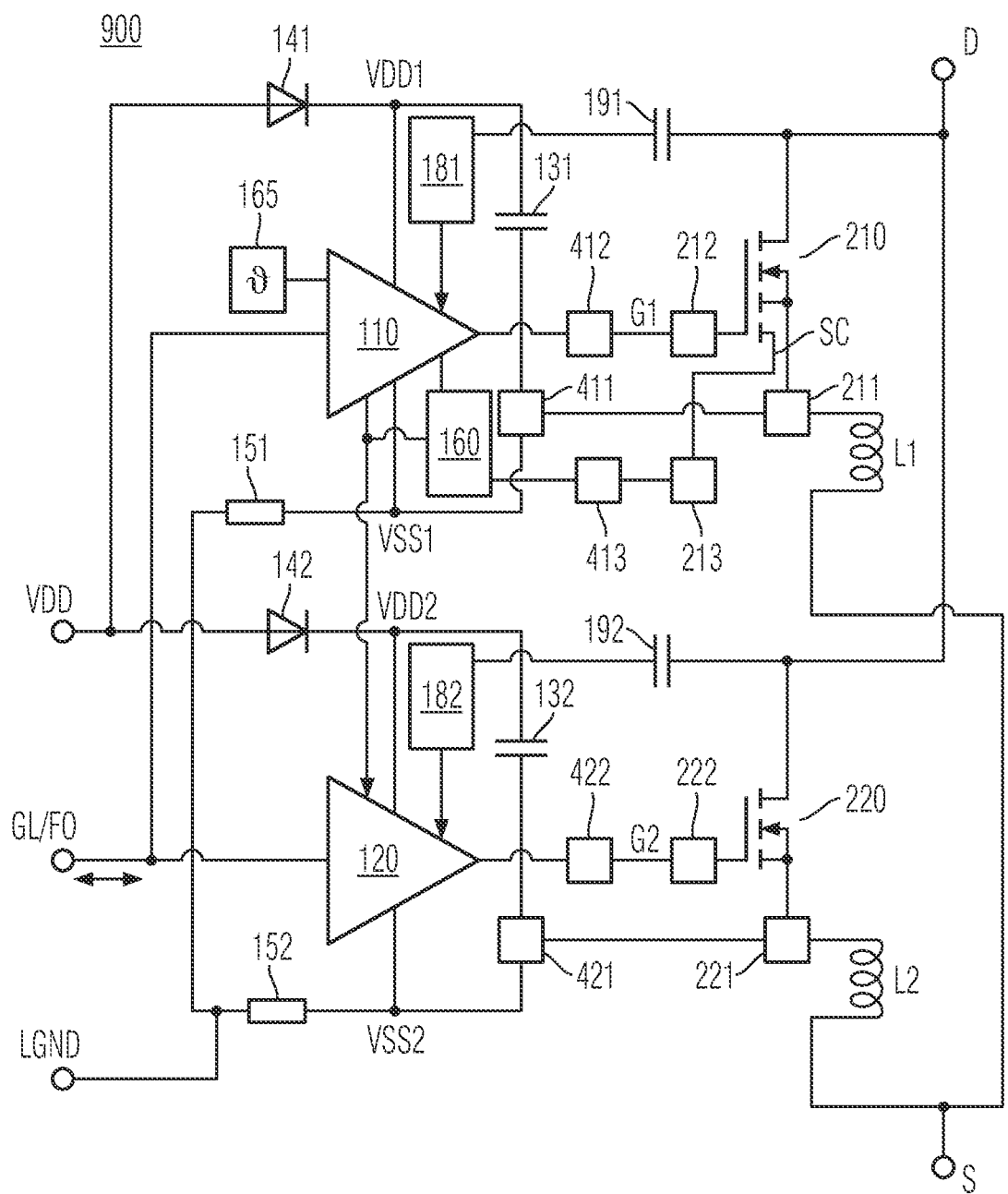
FIG. 10 is a schematic circuit diagram of a power switching assembly according to an embodiment with two semiconductor switches electrically connected in parallel and a gate driver circuit including two driver circuits and two feedback capacitances.

In FIG. 10 a first feedback capacitance 191 is connected between the drain lead D and the first driver circuit 110, and a second feedback capacitance 192 is connected between the drain lead D and the second driver circuit 120. A first gate signal control unit 181 controls a steepness of transitions of the first gate signal GS1 in response to a detection signal received through the first feedback capacitance 191. A second gate signal control unit 181 controls a steepness of transitions of the second gate signal GS2 in response to a detection signal received through the second feedback capacitance 192. By doing so, the output current of the power switch part 200 can be adjusted to maintain a fixed dv/dt as required by a specific application.

Figure 11A:
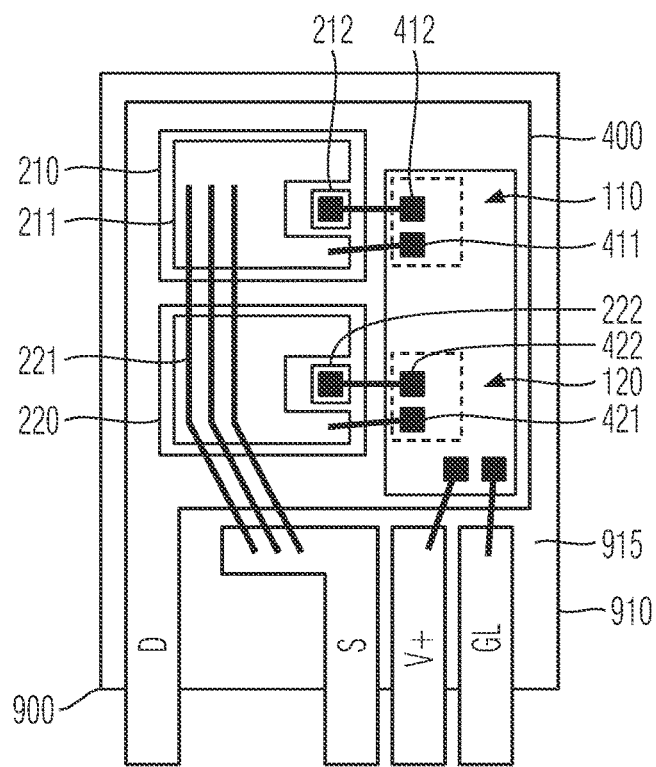
FIG. 11A and FIG. 11B are schematic plan views of power switching assemblies with two semiconductor switches electrically connected in parallel and a gate driver semiconductor die having two gate driver circuits, according to further embodiments.

FIG. 11A shows a power switching assembly 900 according to FIG. 3, FIG. 4, FIG. 8, FIG. 9 or FIG. 10 with the first driver circuit 110, the second driver circuit 120, the first power semiconductor switch 210, and the second power semiconductor switch 220 integrated in a semiconductor package 910 of the T0247-4 family.

The first and second power semiconductor switches 210, 220 are MOSFETs with a vertical load current flow between a source pad 211, 221 at a front side and a drain electrode on a backside of the power semiconductor switch 210, 220. Gate pads 212, 222 of the first and second power semiconductor switches 210, 220 are formed next to the source pads 211, 212 at the front side.

The first driver circuit 110 and the second driver circuit 120 are integrated in a single semiconductor die 199. First and second reference pads 411, 421 and first and second gate output pads 412, 422 are formed at a front side of the semiconductor die 199. A conductive film may cover a back side of the semiconductor die 199.

The semiconductor package 910 includes a source led S, a lead for the positive supply port V+, a lead for the control port GL, and a conductive base plate 920, wherein a portion of the base plate 920 forms a drain lead D.

The first and second power semiconductor switches 210, 220 are soldered onto the base plate 920, wherein the drain electrodes and the base plate 920 form electrical contacts. The conductive film on the back side of the semiconductor die 199 is soldered to the base plate 920.

Bond wires and/or metal clips electrically connect the first reference pad 411 with the first source pad 211, the first gate output pad 412 with the first gate pad 212, the second reference pad 421 with the second source pad 221, the second gate output pad 422 with the second gate pad 222, the first and second source pads 211, 221 with the source lead S, the lead for the positive supply port V+ with a pad for the positive supply port V+ on a front side of the semiconductor die 199, and the lead for the control port GL with a pad for the control port GL on a front side of the semiconductor die 199.

A mould material 915 fixes the package leads relative to each other and encapsulates the first driver circuit 110, the second driver circuit 120, the first power semiconductor switch 210, the second power semiconductor switch 220, and the bond wires and/or metal clips.

Figure 11B:
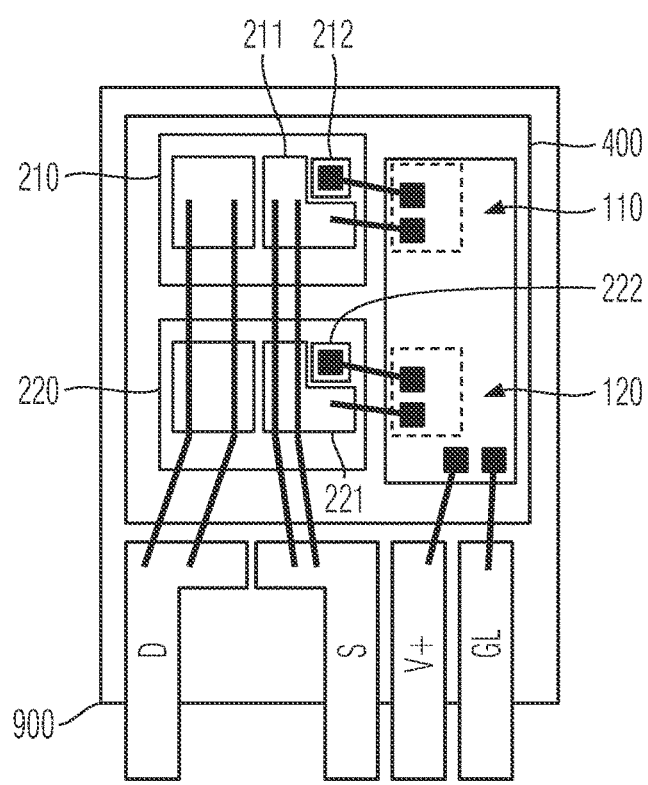

In the first and second power semiconductor switches 210, 220 of the power switching assembly 900 shown in FIG. 11B, the load current flows in a lateral direction between a source pad 211, 221 at a front side and a drain pad 251, 252 at the front side. For example, the first and second power semiconductor switches 210, 220 are GaN HEMTs. The gate pads 212, 222 of the first and second power semiconductor switches 210, 220 are formed next to the source pads 211, 212 and drain pads 251, 252 at the front side.

The conductive base plate 920 is separated from the drain lead D. Additional bond wires and/or metal clips electrically connect the first and second drain pads 251, 252 with the drain lead D.

In the illustrated example, the power switch part 200 is used as the low-side switch in a half bridge, and a base plate wiring connection 925 electrically connects the base plate 920 with at least one of the source pads 211, 221. In another example (not illustrated), the power switch part 200 is used as the high-side switch in a half bridge, and the base plate wiring connection 925 electrically connects the base plate 920 with at least one of the drain pads 251, 252.

In case the first and second power semiconductor switches 210, 220 include a floating substrate on the back side, a connection between the base plate 920 and a suitable constant voltage reduces switching losses caused by charging and discharging a parasitic capacitance to the heatsink, which is typically grounded. In case of a perfectly isolating power switch the base plate 920 may be connected to protecting earth, e.g. via the heatsink.

Figure 12:
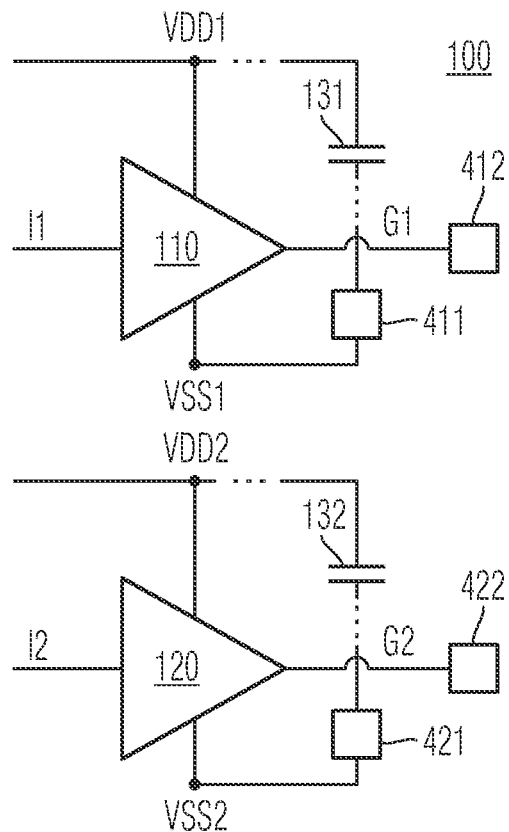
FIG. 12 is a schematic circuit diagram of a gate driver circuit having two gate driver circuits and two external buffer capacitors, according to another embodiment.

FIG. 12 shows a gate driver circuit 100 with a first driver circuit no and a second driver circuit 120. The first driver circuit no is supplied via a first internal supply node VDD1 and a first reference node VSS1 and outputs a first gate signal G1. The second driver circuit 130 is supplied via a second internal supply node VDD3 and a second reference node VSS2 and outputs a second gate signal G2. The first gate signal G1 and the second gate signal G2 are in phase. The first reference node VSS1 and the second reference node VSS2 are separated.

A first reference pad 411 is electrically connected with the first reference node VSS1. A second reference pad 421 is electrically connected with the second reference node VSS2. An output of the first driver circuit no is electrically connected to a first gate output pad 412. An output of the second driver circuit 120 is electrically connected to a second gate output pad 422.

For example, a first auxiliary bond wire 411 may connect the first reference pad 410 with a load pad of a first power semiconductor switch 210, wherein the first auxiliary bond wire 411 forms part of a Kelvin connection between the load pad of the first power semiconductor switch and the first reference node of the first driver circuit. The load pad may be the source pad of an MOSFET or the emitter pad of an IGBT, by way of example.

A first buffer capacitor 131 is electrically connectable between the first internal supply node VDD1 and the first reference node VSS1. A second buffer capacitor 132 is electrically connectable between the second internal supply node VDD2 and the second reference node VSS2. Each buffer capacitor 131, 132 may be a pick- and placeable component.

Figure 13:
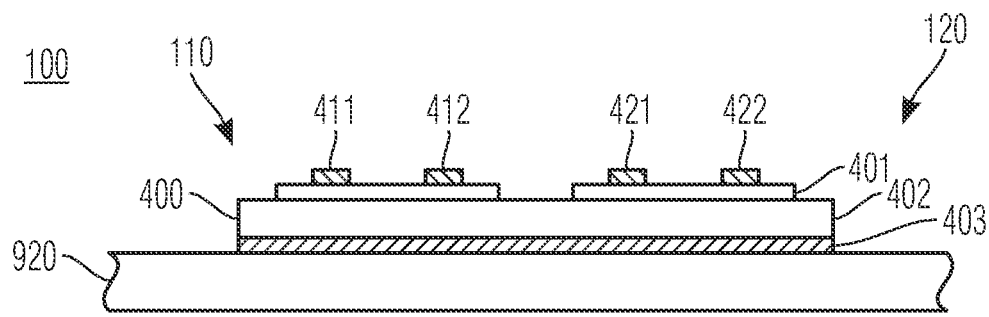
FIG. 13 is a schematic vertical cross-sectional view of a power switching assembly having two individual gate driver semiconductor dies, according to further embodiments.

FIG. 13 shows an example of the gate driver circuit 100 of FIG. 12 realized in SOI technology.

A semiconductor die for the gate driver circuit 100 includes a substrate layer 403 and an SOI insulator layer 402 formed on a planar surface of the substrate layer 403. The substrate layer 403 includes a semiconducting portion and/or a highly conductive portion, and is connected to a base plate 920. The SOI insulator layer 402 may be or may include a silicon oxide layer of uniform thickness. The first driver circuit no and the second driver circuit 120 are formed in laterally separated portions of a semiconductor layer 401 formed on a planar front surface of the SOI insulator layer 402. The first reference pad 411, the first gate output pad 412, the second reference pad 421, and the second gate output pad 422 are formed at a front side of the semiconductor layer 401.

Figure 14:
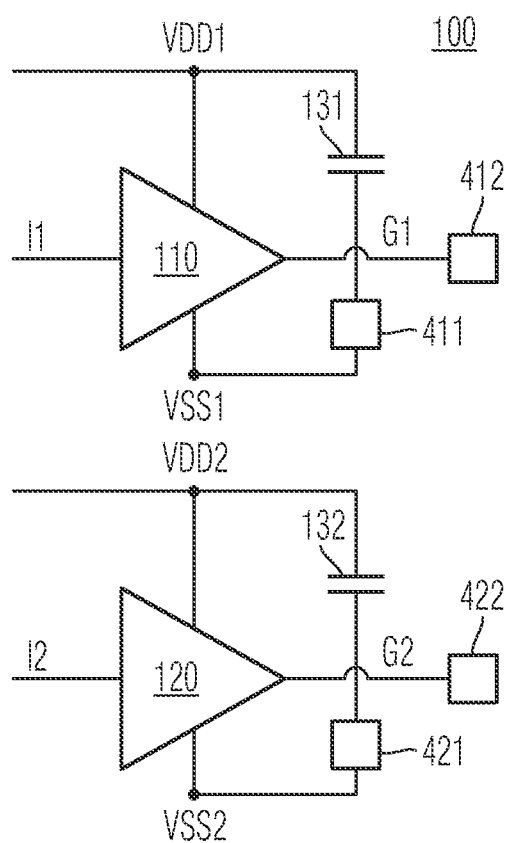
FIG. 14 is a schematic circuit diagram of a gate driver circuit according to an embodiment with two gate driver circuits and two integrated buffer capacitors.

FIG. 14 shows the first and second buffer capacitors 131, 132 integrated in the semiconductor die 400 with the gate driver circuit 100.

Figure 15A:
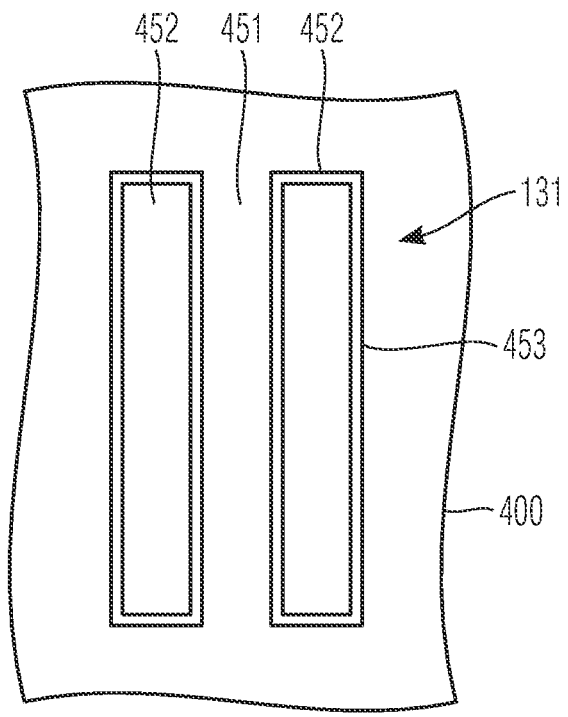
FIG. 15A and FIG. 15B show a schematic plan view and a corresponding schematic vertical cross-sectional view of a portion of a gate driver circuit according to embodiments with integrated buffer capacitors'
Figure 15B:
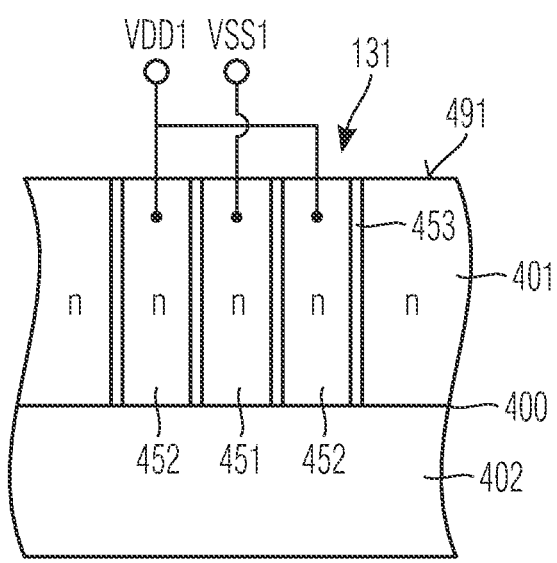

FIG. 15A and FIG. 15 show the integration of the first buffer capacitor 131 into a gate driver circuit 100 based on a semiconductor die 400 in SOI technology.

The semiconductor die 400 has two parallel or approximately parallel main surfaces 491, 492, which have approximately the same shape and size. The semiconductor die has a surface extension along two horizontal directions and a thickness along a vertical direction perpendicular to the horizontal directions. In the following, the horizontal directions are also referred to as lateral directions, the main surface at the front side is referred to as first surface 491 and the main surface at the side opposite to the front side is referred to as second surface 492. The thickness is small comparted to lateral dimensions of the semiconductor die 400.

The semiconductor die 400 includes an SOI insulator layer 402 of uniform thickness and a semiconductor layer 401 formed on a planar front surface of the SOI insulator layer 402. In the illustrated portion, the semiconductor layer 401 is n doped and has comparatively high electric conductivity. One or more deep trench isolator structures 455 extend from the first main surface 491 at the front side of the semiconductor layer 401 into the semiconductor layer 401 down to the SOI insulator layer 402. Each deep trench isolator structure 455 forms a closed frame. First layer portions 451 of the semiconductor layer 401 within the frames form a first electrode of the first buffer capacitor 131 and part of the first internal supply node VDD1. A second layer portion 452 of the semiconductor layer 401 laterally enclosing the frames forms a second electrode of the first buffer capacitor 131 and part of the first reference node VSS1.

Figure 16:
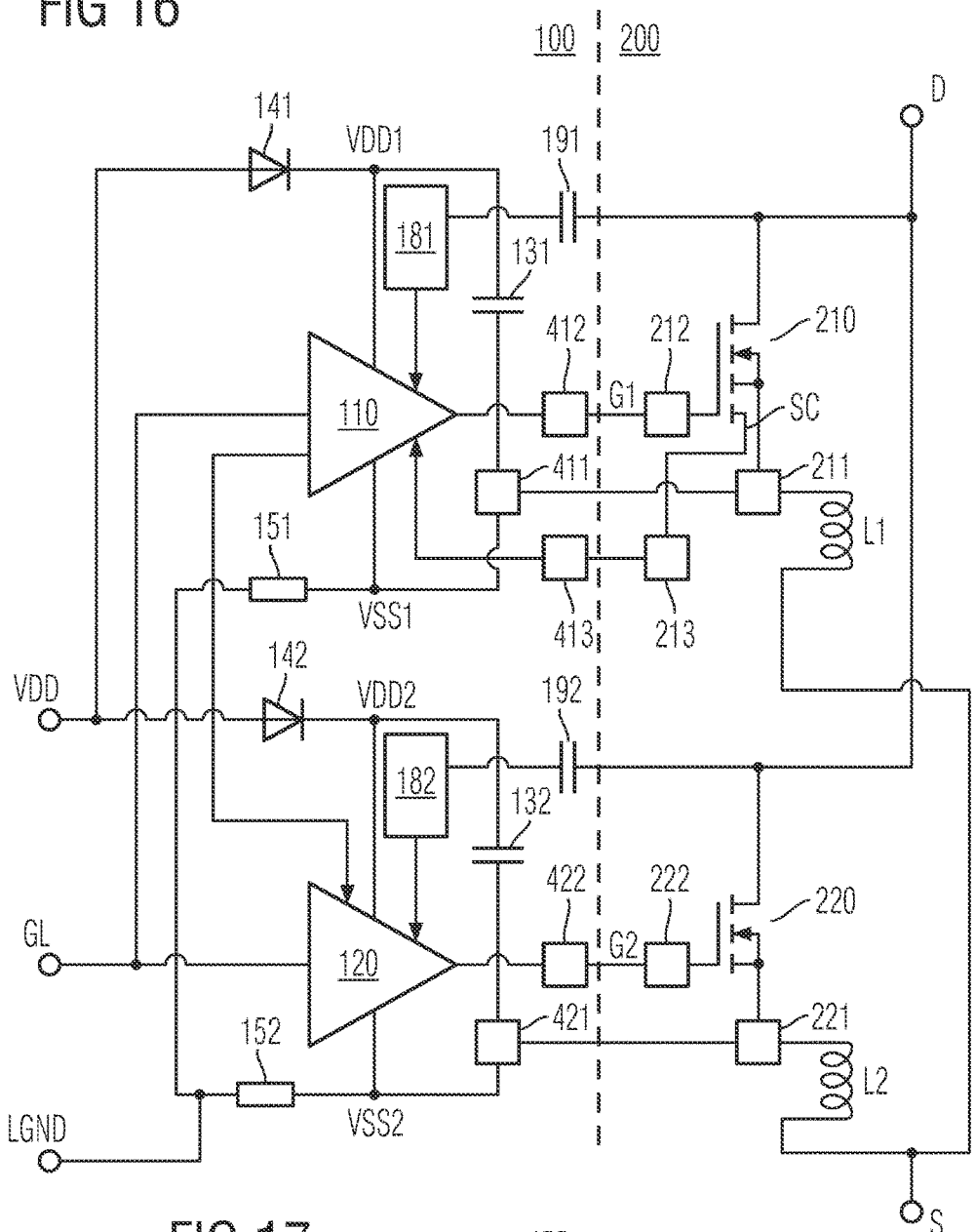
FIG. 16 is a schematic circuit diagram of a power switching assembly with two semiconductor switches electrically connected in parallel, a gate driver circuit having two gate driver circuits, and feedback capacitances, according to another embodiment.

The power switching assembly of FIG. 16 differs from the one illustrated in FIG. 10 in that the first and second feedback capacitances 191, 192 are integrated in the semiconductor die 400 of the gate driver circuit boo.

Figure 17:
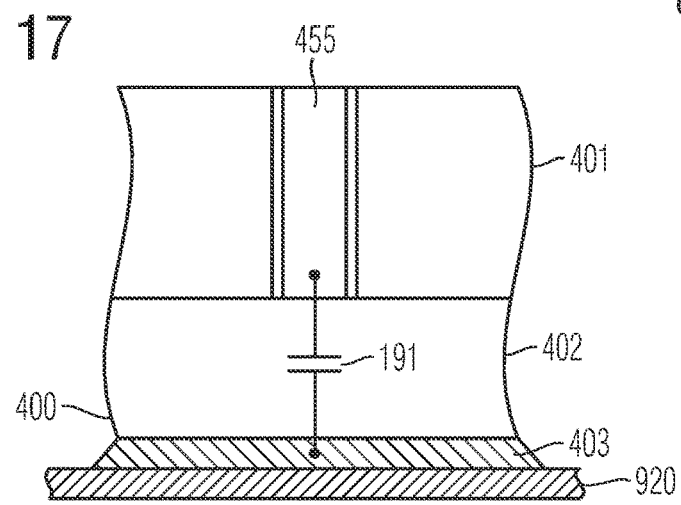
FIG. 17 shows a schematic vertical cross-sectional view of a portion of a power switching assembly according to a further embodiment with integrated feedback capacitances.

FIG. 17 shows semiconductor die 400 for a gate driver circuit 100 with integrated first feedback capacitance 191. A back side of the semiconductor die 400 is attached to a base plate 920.

One or more deep trench isolator structures 455 extend from the first main surface 491 at the front side of the semiconductor layer 401 into the semiconductor layer 401 down to the SOI insulator layer 402. Each deep trench isolator structure 455 forms a closed frame and third layer portions 453 of the semiconductor layer 401 within the frames form a first electrode of the first feedback capacitor 191.

The base plate and/or a conductive substrate layer 403 of the semiconductor die 400 forms a second electrode of the first feedback capacitance 191. The electrodes of the first feedback capacitance are formed on opposite sides of the SOI insulator layer 402.

What is claimed is:

1. A power switching assembly, comprising:
   a first driver circuit configured to drive a first gate signal and supplied via a first internal supply node and a first reference node;
   a second driver circuit configured to drive a second gate signal and supplied via a second internal supply node and a second reference node, wherein the first gate signal and the second gate signal are configured to be in phase with each other, and the first reference node and the second reference node are separated;
   a first buffer capacitor electrically connected between the first internal supply node and the first reference node;
   a second buffer capacitor electrically connected between the second internal supply node and the second reference node; and
   a charging circuit comprising:
      a first supply diode electrically connected in a forward direction between a first differential port and the first internal supply node,
      a second supply diode electrically connected in the forward direction between a second differential port and the first internal supply node,
      a third supply diode electrically connected in the forward direction between the first differential port and the second internal supply node, and
      a fourth supply diode electrically connected in the forward direction between the second differential port and the second internal supply node.

2. The power switching assembly according to claim 1, wherein the first reference node is electrically connected to a first reference pad and the second reference node is electrically connected to a second reference pad.

3. The power switching assembly according to claim 1, wherein the charging circuit is configured to charge the first buffer capacitor and the second buffer capacitor from the first differential port in a first mode, and to decouple the first differential port from the first buffer capacitor and the second buffer capacitor in a second mode.

4. The power switching assembly according to claim 1, wherein:
   the first driver circuit is configured to obtain the first gate signal from a low-level input signal; and
   the second driver circuit is configured to obtain the second gate signal from the low-level input signal.

5. The power switching assembly according to claim 1, further comprising:
   a first current limiting resistor electrically connected between a signal ground port and the first reference node; and
   a second current limiting resistor electrically connected between the signal ground port and the second reference node.

6. The power switching assembly according to claim 1, further comprising:
   a differentiator circuit configured to obtain a differential input signal from a low-level input signal, wherein the first driver circuit is configured to obtain the first gate signal from the differential input signal, and wherein the second driver circuit is configured to obtain the second gate signal from the differential input signal.

7. The power switching assembly according to claim 1, further comprising a protection circuit configured to:
   receive a sense signal; and
   in response to the sense signal indicating a fault condition, output a fault signal to the first driver circuit or the second driver circuit.

8. The power switching assembly according to claim 1, further comprising:
a first power semiconductor switch comprising a first gate electrode configured to receive the first gate signal; and
a second power semiconductor switch comprising a second gate electrode configured to receive the second gate signal, wherein load paths of the first power semiconductor switch and the second power semiconductor switch are electrically connected in parallel.

9. The power switching assembly according to claim 8, wherein the first driver circuit, the second driver circuit, the first power semiconductor switch, and the second power semiconductor switch are integrated in a single semiconductor package.

10. A gate driver circuit, comprising:
a first driver circuit configured to drive a first gate signal and supplied via a first internal supply node and a first reference node;
a second driver circuit configured to drive a second gate signal and supplied via a second internal supply node and a second reference node, wherein the first gate signal and the second gate signal are configured to be in phase with each other, and wherein the first reference node and the second reference node are separated;
a first reference pad electrically connected with the first reference node;
a second reference pad electrically connected with the second reference node; and
a charging circuit comprising:
a first supply diode electrically connected in a forward direction between a first differential port and the first internal supply node,
a second supply diode electrically connected in the forward direction between a second differential port and the first internal supply node,
a third supply diode electrically connected in the forward direction between the first differential port and the second internal supply node, and
a fourth supply diode electrically connected in the forward direction between the second differential port and the second internal supply node.

11. The gate driver circuit according to claim 10, wherein the first driver circuit and the second driver circuit are disposed in laterally separated portions of a semiconductor layer located on a planar front surface of an SOI insulator layer.

12. The gate driver circuit according to claim 11, further comprising:
a first buffer capacitor electrically connected between the first internal supply node and the first reference node, and
a second buffer capacitor electrically connected between the second internal supply node and the second reference node,
wherein electrodes of at least one of the first buffer capacitor and the second buffer capacitor are disposed on opposite sides of a trench isolator structure extending through the semiconductor layer.

13. The gate driver circuit of claim 12, wherein the charging circuit is configured to:
charge the first buffer capacitor and the second buffer capacitor from the first differential port during a first mode; and
charge the first buffer capacitor and the second buffer capacitor from the second differential port during a second mode.

14. The gate driver circuit according to claim 11, further comprising: a first gate signal control unit configured to control a steepness of transitions of the first gate signal in response to a detection signal received through a first feedback capacitance, wherein electrodes of the first feedback capacitance are disposed on opposite sides of the SOI insulator layer.

15. A method of operating a power switching assembly comprising a first driver circuit supplied via a first internal supply node and a first reference node; a second driver circuit supplied via a second internal supply node and a second reference node; a first buffer capacitor electrically connected between the first internal supply node and the first reference node; and a second buffer capacitor electrically connected between the second internal supply node and the second reference node; a first supply diode electrically connected in a forward direction between a first differential port and the first internal supply node, a second supply diode electrically connected in the forward direction between a second differential port and the first internal supply node, a third supply diode electrically connected in the forward direction between the first differential port and the second internal supply node, and a fourth supply diode electrically connected in the forward direction between the second differential port and the second internal supply node, wherein the first reference node and the second reference node are separated, the method comprising:
driving a first gate signal by the first driver circuit; and
driving a second gate signal by the second driver circuit, wherein the first gate signal and the second gate signal are in phase with each other.

16. The method of claim 15, further comprising:
charging the first buffer capacitor and the second buffer capacitor using a supply voltage in a first mode; and
decoupling the supply voltage from voltage potentials across the first buffer capacitor and the second buffer capacitor in a second mode.

17. The method of claim 15, further comprising:
obtaining, by the first driver circuit, the first gate signal from a low-level input signal; and
obtaining, by the second driver circuit, the second gate signal from the low-level input signal.

18. The method of claim 17, further comprising obtaining a differential signal from the low-level input signal, wherein:
obtaining, by the first driver circuit, the first gate signal from the low-level input signal comprises obtaining the first gate signal from the differential signal; and
obtaining, by the second driver circuit, the second gate signal from the low-level input signal comprises obtaining the second gate signal from the differential signal.

19. The method of claim 15, further comprising:
receiving a sense signal; and
in response to the sense signal indicating a fault condition, outputting a fault signal to the first driver circuit or the second driver circuit.

20. The method of claim 15, further comprising:
charging the first buffer capacitor and the second buffer capacitor from the first differential port via the first supply diode and the third supply diode during a first mode; and
charging the first buffer capacitor and the second buffer capacitor from the second differential port via the second supply diode and the fourth supply diode during a second mode.

* * * * *